(12) United States Patent
Aghababazadeh et al.

(10) Patent No.: US 8,990,759 B2
(45) Date of Patent: *Mar. 24, 2015

(54) CONTACTLESS TECHNIQUE FOR EVALUATING A FABRICATION OF A WAFER

(75) Inventors: Majid Aghababazadeh, San Jose, CA (US); Jose J. Estabil, Weston, CT (US); Nader Pakdaman, Monte Sereno, CA (US); Gary L. Steinbrueck, Wappingers, NY (US)

(73) Assignee: tau-Metrix, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/791,665

(22) Filed: Jun. 1, 2010

(65) Prior Publication Data

US 2010/0304509 A1 Dec. 2, 2010

Related U.S. Application Data

(63) Continuation of application No. 10/927,275, filed on Aug. 25, 2004, now Pat. No. 7,730,434.

(60) Provisional application No. 60/497,945, filed on Aug. 25, 2003, provisional application No. 60/563,168, filed on Apr. 15, 2004.

(51) Int. Cl.
*G06F 17/50* (2006.01)
*H01L 21/66* (2006.01)
(Continued)

(52) U.S. Cl.
CPC ............ *H01L 22/20* (2013.01); *G01R 31/2831* (2013.01); *G01R 31/3025* (2013.01);
(Continued)

(58) Field of Classification Search
USPC ........ 716/51–52, 56, 136; 702/127, 134, 172; 324/457–458
See application file for complete search history.

(56) References Cited

U.S. PATENT DOCUMENTS

| 1,342,885 A | 6/1920 | Armstrong |
| 3,970,875 A | 7/1976 | Leehan |

(Continued)

FOREIGN PATENT DOCUMENTS

| EP | 0 652 444 | 5/1995 |
| EP | 0 892 275 | 1/1999 |

(Continued)

OTHER PUBLICATIONS

U.S. Appl. No. 10/927,258, filed Aug. 25, 2004, Aghababazadeh et al.
(Continued)

*Primary Examiner* — Nghia Doan
(74) *Attorney, Agent, or Firm* — Mahamedi Paradice LLP

(57) ABSTRACT

The fabrication of the wafer may be analyzed starting from when the wafer is in a partially fabricated state. The value of a specified performance parameter may be determined at a plurality of locations on an active area of a die of the wafer. The specified performance parameter is known to be indicative of a particular fabrication process in the fabrication. Evaluation information may then be obtained based on a variance of the value of the performance parameter at the plurality of locations. This may be done without affecting a usability of a chip that is created from the die. The evaluation information may be used to evaluate how one or more processes that include the particular fabrication process that was indicated by the performance parameter value was performed.

22 Claims, 18 Drawing Sheets

(51) Int. Cl.
*G01R 31/28* (2006.01)
*G01R 31/302* (2006.01)
*G01R 31/317* (2006.01)
*G01R 31/3185* (2006.01)

(52) U.S. Cl.
CPC .... *G01R31/31707* (2013.01); *G01R 31/31718* (2013.01); *G01R 31/318505* (2013.01); *G01R 31/318511* (2013.01); *H01L 22/34* (2013.01)
USPC ............. 716/136; 716/51; 716/52; 716/56; 702/127; 702/134; 702/172; 324/457; 324/458

(56) References Cited

U.S. PATENT DOCUMENTS

| | | | |
|---|---|---|---|
| 4,122,396 A | 10/1978 | Grazier et al. | |
| 4,184,894 A | 1/1980 | Lindmayer et al. | |
| 4,342,879 A | 8/1982 | Catalano et al. | |
| 4,443,653 A | 4/1984 | Catalano et al. | |
| 4,680,635 A | 7/1987 | Khurana | |
| 4,681,449 A | 7/1987 | Bloom et al. | |
| 4,755,874 A | 7/1988 | Esrig et al. | |
| 4,758,092 A | 7/1988 | Heinrich et al. | |
| 4,820,916 A | 4/1989 | Patriquin | |
| 4,829,238 A | 5/1989 | Goulette et al. | |
| 4,959,603 A | 9/1990 | Yamamoto et al. | |
| 4,963,729 A | 10/1990 | Spillman et al. | |
| D315,561 S | 3/1991 | Miller | |
| 5,006,788 A | 4/1991 | Goulette et al. | |
| 5,028,866 A | 7/1991 | Wiese | |
| 5,030,908 A | 7/1991 | Miyoshi et al. | |
| 5,068,547 A | 11/1991 | Gascoyne | |
| 5,095,267 A | 3/1992 | Merrill et al. | |
| 5,218,294 A | 6/1993 | Soiferman | |
| 5,270,655 A | 12/1993 | Tomita | |
| 5,286,656 A | 2/1994 | Keown et al. | |
| 5,459,402 A | 10/1995 | Ueno et al. | |
| 5,486,786 A | 1/1996 | Lee | |
| 5,508,610 A | 4/1996 | Feeney | |
| 5,520,968 A | 5/1996 | Wynne et al. | |
| 5,551,065 A | 8/1996 | Honore | |
| 5,570,035 A | 10/1996 | Dukes et al. | |
| 5,581,094 A | 12/1996 | Hara et al. | |
| 5,631,571 A | 5/1997 | Spaziani et al. | |
| 5,631,572 A | 5/1997 | Sheen et al. | |
| 5,640,539 A | 6/1997 | Goishi et al. | |
| 5,663,967 A | 9/1997 | Prasad et al. | |
| 5,721,688 A | 2/1998 | Barnwell | |
| 5,764,655 A | 6/1998 | Kirihata et al. | |
| 5,872,360 A | 2/1999 | Paniccia et al. | |
| 5,898,186 A | 4/1999 | Farnworth et al. | |
| 5,903,012 A | 5/1999 | Boerstler | |
| 5,905,577 A | 5/1999 | Wilsher et al. | |
| 5,940,545 A | 8/1999 | Kash et al. | |
| 5,949,900 A | 9/1999 | Nakamura et al. | |
| 6,028,435 A | 2/2000 | Nikawa | |
| 6,040,592 A | 3/2000 | McDaniel et al. | |
| 6,058,497 A | 5/2000 | Tuttle | |
| 6,066,956 A | 5/2000 | Nikawa | |
| 6,107,107 A | 8/2000 | Bruce et al. | |
| 6,119,255 A | 9/2000 | Akram | |
| 6,124,143 A | 9/2000 | Sugasawara | |
| 6,161,205 A | 12/2000 | Tuttle | |
| 6,184,696 B1 | 2/2001 | White et al. | |
| 6,189,120 B1 | 2/2001 | Akram | |
| 6,239,603 B1 | 5/2001 | Ukei et al. | |
| 6,281,696 B1 | 8/2001 | Voogel | |
| 6,300,785 B1 | 10/2001 | Cook et al. | |
| 6,331,782 B1 | 12/2001 | White et al. | |
| 6,368,884 B1 | 4/2002 | Goodwin et al. | |
| 6,385,361 B1 | 5/2002 | Corr | |
| 6,448,802 B1 | 9/2002 | Hirt | |
| 6,449,749 B1 | 9/2002 | Stine | |
| 6,455,766 B1 | 9/2002 | Cook et al. | |
| 6,463,570 B1 | 10/2002 | Dunn et al. | |
| 6,475,871 B1 | 11/2002 | Stine et al. | |
| 6,504,393 B1 | 1/2003 | Lo et al. | |
| 6,507,942 B1 | 1/2003 | Calderone et al. | |
| 6,509,197 B1 | 1/2003 | Satya et al. | |
| 6,545,333 B1 | 4/2003 | Ketchen et al. | |
| 6,549,022 B1 | 4/2003 | Cole, Jr. et al. | |
| 6,553,545 B1 | 4/2003 | Stinson et al. | |
| 6,562,639 B1 * | 5/2003 | Minvielle et al. | ............... 438/14 |
| 6,605,981 B2 | 8/2003 | Bryant et al. | |
| 6,621,275 B2 | 9/2003 | Cotton et al. | |
| 6,657,446 B1 | 12/2003 | Goruganthu et al. | |
| 6,686,755 B2 | 2/2004 | White et al. | |
| 6,711,721 B2 | 3/2004 | Brennan | |
| 6,731,122 B2 | 5/2004 | Feng | |
| 6,759,863 B2 * | 7/2004 | Moore | ............... 324/762.03 |
| 6,798,261 B1 | 9/2004 | Bhushan et al. | |
| 6,825,682 B2 | 11/2004 | Kantz et al. | |
| 6,850,081 B1 | 2/2005 | Birdsley et al. | |
| 6,859,031 B2 | 2/2005 | Pakdaman et al. | |
| 6,859,587 B2 | 2/2005 | Nikonov et al. | |
| 6,865,503 B2 | 3/2005 | Harper et al. | |
| 6,893,883 B2 | 5/2005 | Hui et al. | |
| 6,939,727 B1 | 9/2005 | Allen, III et al. | |
| 6,958,659 B2 | 10/2005 | Nakajima | |
| 6,960,926 B2 | 11/2005 | Anderson et al. | |
| 6,976,234 B2 | 12/2005 | Kasapi | |
| 6,985,219 B2 | 1/2006 | Wilsher et al. | |
| 7,005,876 B2 | 2/2006 | Wei et al. | |
| 7,012,440 B2 | 3/2006 | Feng | |
| 7,012,537 B2 | 3/2006 | Woods et al. | |
| 7,020,859 B2 | 3/2006 | Schinella | |
| 7,024,066 B1 | 4/2006 | Malendevich et al. | |
| 7,042,563 B2 | 5/2006 | Wilsher et al. | |
| 7,155,360 B2 | 12/2006 | Shinohara | |
| 7,220,990 B2 | 5/2007 | Aghababazadeh et al. | |
| 7,256,055 B2 | 8/2007 | Aghababazadeh et al. | |
| 7,339,388 B2 | 3/2008 | Aghababazadeh et al. | |
| 7,423,288 B2 | 9/2008 | Aghababazadeh et al. | |
| 7,605,597 B2 | 10/2009 | Aghababazadeh et al. | |
| 7,730,434 B2 * | 6/2010 | Aghababazadeh et al. | ... 716/136 |
| 7,736,916 B2 * | 6/2010 | Aghababazadeh et al. | ..... 438/11 |
| 2001/0001391 A1 | 5/2001 | Kamieniecki | |
| 2001/0005145 A1 | 6/2001 | White et al. | |
| 2002/0047722 A1 | 4/2002 | Cook et al. | |
| 2002/0171468 A1 | 11/2002 | Bryant et al. | |
| 2003/0146761 A1 | 8/2003 | Pakdaman et al. | |
| 2003/0146771 A1 | 8/2003 | Moore | |
| 2003/0237029 A1 | 12/2003 | Anderson et al. | |
| 2005/0012556 A1 | 1/2005 | Bhushan et al. | |
| 2005/0085032 A1 | 4/2005 | Aghababazadeh et al. | |
| 2005/0085932 A1 | 4/2005 | Aghababazadeh et al. | |
| 2005/0090027 A1 | 4/2005 | Aghababazadeh et al. | |
| 2005/0090916 A1 | 4/2005 | Aghababazadeh et al. | |
| 2006/0044004 A1 | 3/2006 | Bhushan et al. | |
| 2006/0100811 A1 | 5/2006 | Bhushan et al. | |
| 2007/0004063 A1 | 1/2007 | Aghababazadeh et al. | |
| 2007/0187679 A1 | 8/2007 | Aghababazadeh et al. | |
| 2007/0236232 A1 | 10/2007 | Aghababazadeh et al. | |
| 2007/0238206 A1 | 10/2007 | Aghababazadeh et al. | |
| 2008/0100319 A1 | 5/2008 | Aghababazadeh et al. | |
| 2008/0315196 A1 | 12/2008 | Aghababazadeh et al. | |

FOREIGN PATENT DOCUMENTS

| | | |
|---|---|---|
| WO | WO 99/32893 | 7/1999 |
| WO | WO 00/72030 | 11/2000 |
| WO | WO 01/52320 | 7/2001 |
| WO | WO 01/80306 | 10/2001 |

OTHER PUBLICATIONS

U.S. Appl. No. 10/927,260, filed Aug. 25, 2004, Aghababazadeh et al.
U.S. Appl. No. 10/927,275, filed Aug. 25, 2004, Aghababazadeh et al.
U.S. Appl. No. 10/927,406, filed Aug. 25, 2004, Aghababazadeh et al.
U.S. Appl. No. 11/469,305, filed Aug. 31, 2006, Aghababazadeh et al.
U.S. Appl. No. 11/738,219, filed Apr. 20, 2007, Aghababazadeh et al.
U.S. Appl. No. 11/762,944, filed Jun. 14, 2007, Aghababazadeh et al.
U.S. Appl. No. 11/763,001, filed Jun. 14, 2007, Aghababazadeh et al.
U.S. Appl. No. 11/935,297, filed Nov. 5, 2007, Aghababazadeh et al.

(56) References Cited

OTHER PUBLICATIONS

U.S. Appl. No. 12/196,032, filed Aug. 21, 2008, Aghababazadeh et al.
U.S. Appl. No. 12/557,513, filed Sep. 10, 2009, Aghababazadeh et al.
Baliga, J., "Advanced Process Control Soon to Be a Must," Semiconductor International, Cahners Pub., Newton, Mas, IL, US, Jul. 1999, pp. 76-78, 80, 82, 8, XP009015968, ISSN: 0163-3767, the whole document.
Bowman, Keith A. et al, "Impact of extrinsic and intrinsic parameter variations on CMOS system on a chip performance," 0-7803-5632-2/99 IEEE 1999.
De Almeida, M. et al., "A statistical method for the analysis of CMOS process fluctuations on dynamic performance," 0-7803-3243-1, Proceedings of the IEEE 1997 Int. Conference on Microelectronic Test Structures, vol. 10, Mar. 1997.
Final Office Action mailed Aug. 12, 2008 in U.S. Appl. No. 10/927,275 16 pgs.
Hannaman, D. J. et al., "The inverter matrix—a vehicle for assessing process quality through inverter parameter analysis of variance" CH2907-4/91/0000-0107 IEEE 1991.
International Preliminary Report on Patentability of Jun. 16, 2006 in International Application No. PCT/US04/027770.
International Search Report of Feb. 23, 2006 in International Application No. PCT/US04/027770.
Lei, Junzhao et al., "Predicting system performance variances using enhanced propagation of variance," 0-7803-4756-0/98 IEEE, 1998.
Lei, Junzhao et al.,"Propagation of variance using a new approximation in system design of integrated circuits," 0-7803-4449-9/98 IEEE 1998.
Matsumoto, S. et al., "Test-circuit-based extraction of inter- and intra-chip MOSFET-performance variations for analog-design reliability," 0-70803-6591-7/01 IEEE 2001.
Non-Final Office Action mailed Nov. 23, 2007 in U.S. Appl. No. 10/927,275 11 pgs.
Non-Final Office Action mailed Mar. 10, 2009 in U.S. Appl. No. 10/927,275 19 pgs.
Non-Final Office Action mailed Jul. 3, 2006 in U.S. Appl. No. 10/927,406 6 pgs.
Non-Final Office Action mailed Jul. 9, 2008 in U.S. Appl. No. 11/469,305 7 pgs.
Non-Final Office Action mailed May 6, 2009 in U.S. Appl. No. 11/469,305 7 pgs.
Non-Final Office Action mailed Aug. 8, 2007 in U.S. Appl. No. 11/738,219 6 pgs.
Non-Final Office Action mailed May 13, 2009 in U.S. Appl. No. 11/762,944 7 pgs.
Non-Final Office Action mailed Apr. 6, 2009 in U.S. Appl. No. 11/763,001 11 pgs.
Notice of Allowance mailed Jan. 25, 2007 in U.S. Appl. No. 10/927,260 7 pgs.
Notice of Allowance mailed Dec. 30, 2008 in U.S. Appl. No. 11/935,297 7 pgs.
Notice of Allowance mailed May 29, 2009 in U.S. Appl. No. 11/935,297 5 pgs.
Notice of Allowance mailed Mar. 17, 2006 in U.S. Appl. No. 10/927,260 7 pgs.
Notice of Allowance mailed Mar. 21, 2007 in U.S. Appl. No. 10/927,258 6 pgs.
Notice of Allowance mailed May 1, 2008 in U.S. Appl. No. 11/738,219 7 pgs.
Notice of Allowance mailed Jun. 11, 2008 in U.S. Appl. No. 11/738,219 6 pgs.
Notice of Allowance mailed Sep. 25, 2007 in U.S. Appl. No. 10/927,406 6 pgs.
Nurani, Rama K. et al., "The impact of lot-to-lot and wafer-to-wafer variations on SPC" 0-7803-3737-9/97 IEEE 1997.
Okada, Kenichi et al. "A statistical gate delay model for intra-chip and inter-chip variabilities," 07803-7659-5/03/ IEEE 2003.
Orshansky, Michael eet al., "Intra-field gate CD variability and its impact on circuit performance," 0-7803-5410-9/99 IEEE 1999.
Orshansky, Michael et al, "Characterization of Spatial Intrafield Gate CD Variability, Its Impact on Circuit Performance, and Spatial Mask-Level Correction," IEEE Transactions on Semiconductor Manufacturing, vol. 17, No. 1, Feb. 2004.
Orshansky, Michael, et al. "Impact of spatial intrachip gate length variability on the performance of high-screen digital circuits," IEEE Transactions on Computer Aided Design of Integrated Circuits, vol. 21, No. 5, May 2002.
Orshansky, Michael, et al. "Impact of systematic spatial intra-chip gate length variability on performance of high-speed digital circuits," iccad, p. 62, 2000 International Conference on Computer-Aided Design (ICCAD '00), 2000.
Ouyang, X et al., "High-spatial-frequency MOS transistor gate length variations in SRAM circuits," 0-7803-6275-6-3/00 IEEE 2000.
Rowlands, David et al., "Derivation of a nonlinear variance equation and its application to SOI Technology," IEEE Transactions on Semiconductor Manufacturing, vol. 13, No. 4, Nov. 2000.
Santiesteban, Ramon S. et al., "Effect of tilt angle variations in a halo implant on Vth values for 0.14-um CMOS devices,", IEEE Transactions on Semiconductor Manufacturing, vol. 16, No. 4, Nov. 2003.
K. Soumyanath et al., "Accurate On-Chip Interconnect Evaluation: A Time-Domain Technique", IEEE Journal of Solid-State Circuits, vol. 34, No. 5, pp. 623-631, May 1999.
Written Opinion of Feb. 23, 2006 in International Application No. PCT/US04/027770.
Zeitzoff, Peter, M., "Modeling the Statistical Variability and Optimal Process Control Requirements for a 0.18 µm NMOS Transistor," International SEMATECH, Inc., Austin, TX 78741, May 25, 2001.
Restriction Requirement mailed Mar. 28, 2007 in U.S. Appl. No. 10/927,406 6 pages.
Restriction Requirement mailed Jun. 20, 2007 in U.S. Appl. No. 10/927,275 6 pages.
Restriction Requirement mailed Sep. 25, 2006 in U.S. Appl. No. 10/927,258 6 pages.
Restriction Requirement mailed Sep. 27, 2005 in U.S. Appl. No. 10/927,260 6 pages.
Non-Final Office Action mailed Jun. 10, 2009 in U.S. Appl. No. 12/196,032 7 pgs.
Notice of Allowance mailed Jan. 11, 2010 in U.S. Appl. No. 12/196,032 7 pgs.
Notice of Allowance mailed Jan. 8, 2010 in U.S. Appl. No. 10/927,275 9 pgs.
Non-Final Office Action mailed Feb. 24, 2010 in U.S. Appl. No. 11/469,305 2 pgs.
Notice of Allowance mailed Feb. 1, 2010 in U.S. Appl. No. 11/762,944 4 pgs.
Final Office Action mailed Oct. 21, 2010 in U.S. Appl. No. 11/469,305 9 pgs.
Non-Final Office Action mailed Jan. 23, 2012 in U.S. Appl. No. 11/469,305 7 pgs.

\* cited by examiner

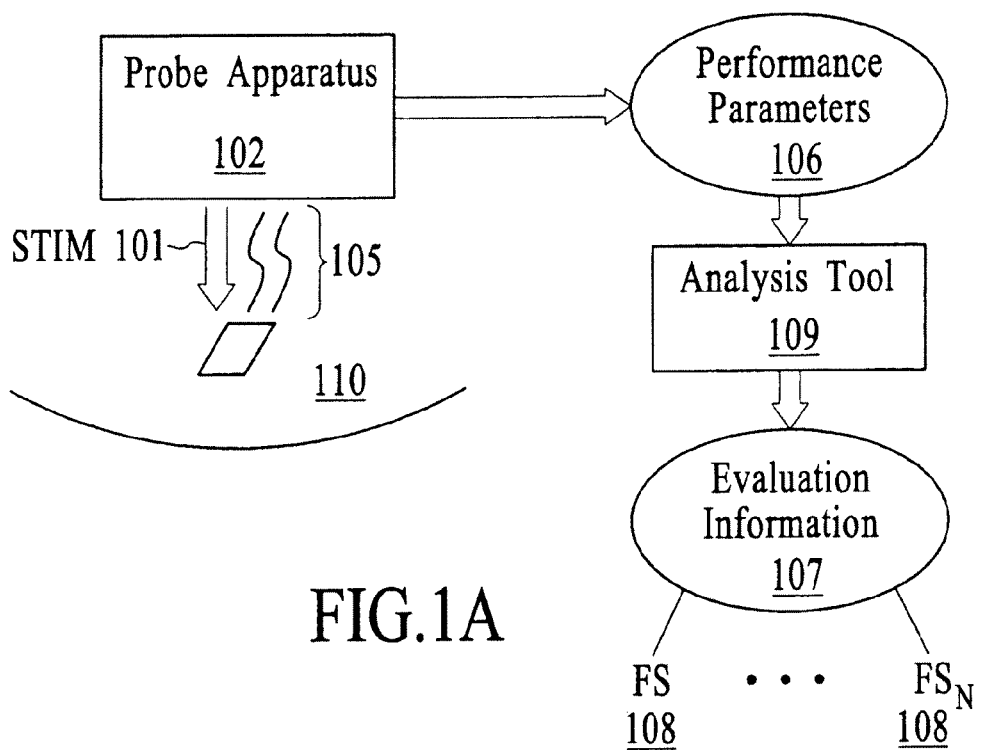
FIG.1A
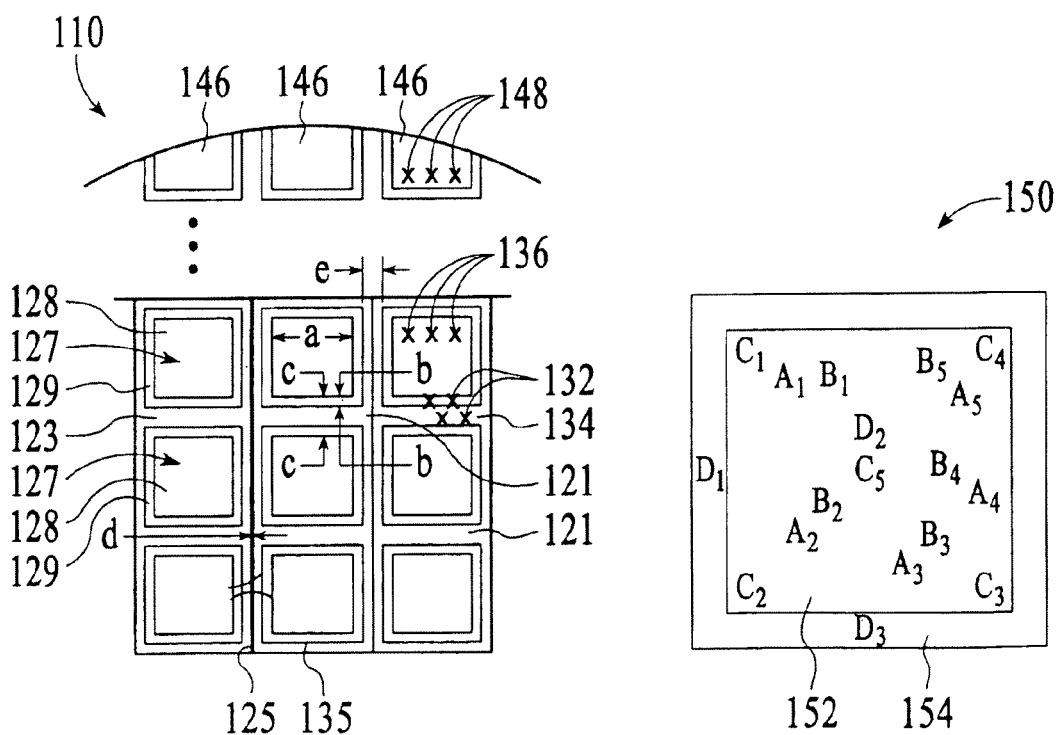
FIG.1B
FIG.1C

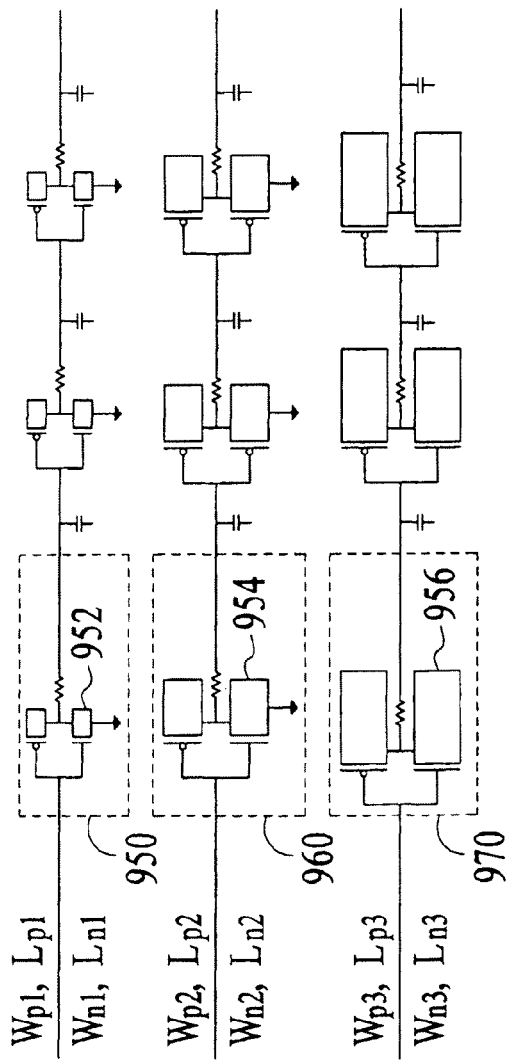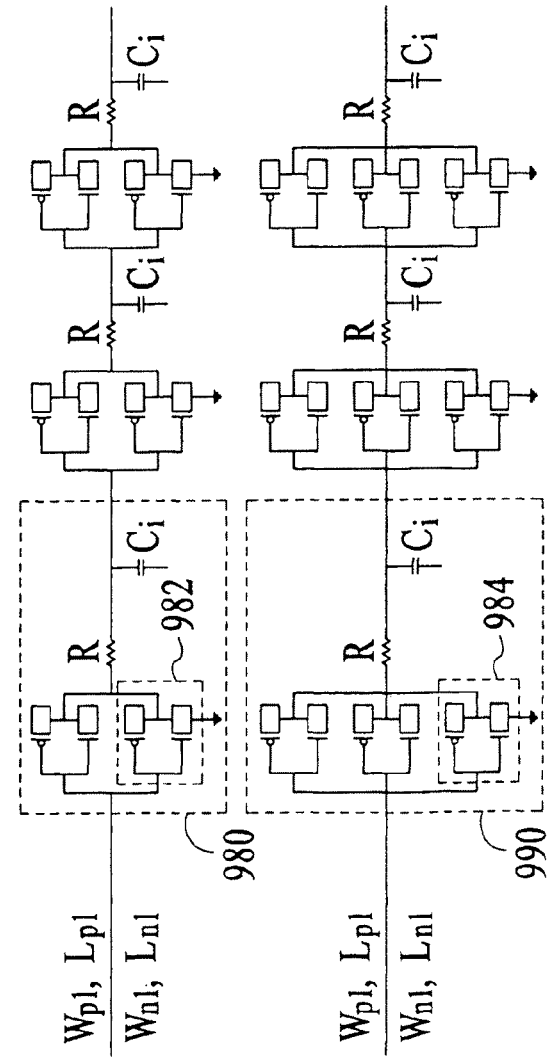

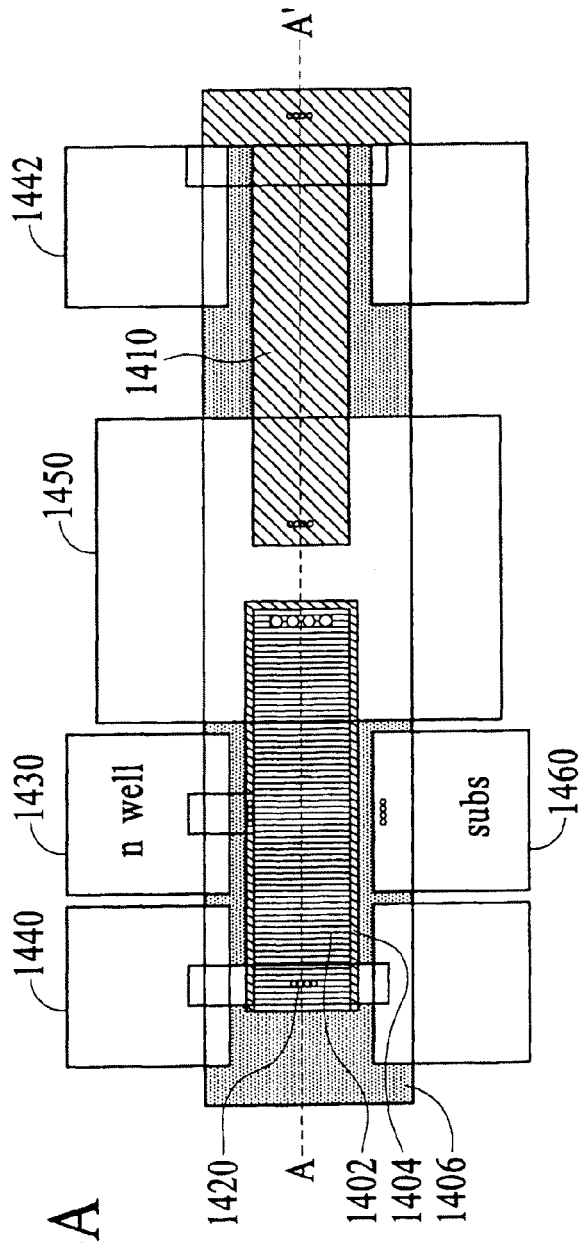
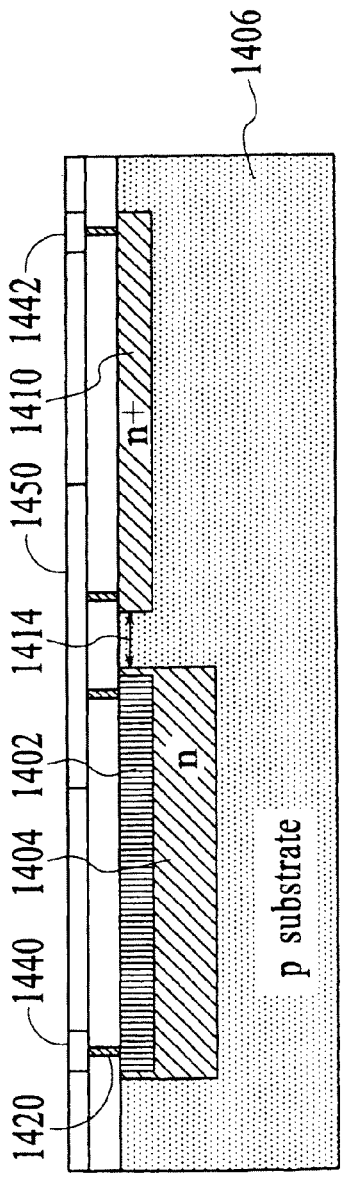
FIG.14A
FIG.14B

CONTACTLESS TECHNIQUE FOR EVALUATING A FABRICATION OF A WAFER

RELATED APPLICATIONS

This application is a continuation of U.S. application Ser. No. 10/927,275, filed on Aug. 25, 2004 now U.S. Pat. No. 7,730,434, which claims priority to U.S. Provisional Patent Application No. 60/497,945, filed Aug. 25, 2003; and to U.S. Provisional Patent Application No. 60/563,168, filed Apr. 15, 2004. All of the aforementioned priority applications are hereby incorporated by reference in their entirety for all purposes.

TECHNICAL FIELD

The present invention generally relates to fabrication of semiconductor components, and more specifically to ways in which the fabrication of such devices can be evaluated.

BACKGROUND

Semiconductor components, such as microprocessors are formed from high-density integrated circuits (ICs). Typically, these components are manufactured by processing a semiconductor wafer (e.g. Silicon, or Gallium Arsenide). The wafer may be fabricated so that transistors, the switch elements, and other elements (e.g. resistors, capacitance, wiring layers etc.) are printed and formed in predetermined patterns, configurations, and locations. Once the wafer has been fully processed and passivated (to protect from the environment), it is diced into separate die, packaged onto carriers and subjected through final test and characterization.

Semiconductor device fabrication is a multi-step and complex process. Numerous steps may be performed. A fabrication process for a wafer (and thus an individual semiconductor component) comprises performing such steps in a designated order, and in a particular manner, so that a desired pattern, formation, and configuration of transistors, devices, and other integrated circuit elements are formed for individual semiconductor components (e.g. "chips") that comprise the wafer. Each process step requires the use of ultrasensitive machinery and techniques. Accordingly, it is often desirable to continuously monitor the quality of the comprise the wafer. Each process step requires the use of ultra-sensitive machinery and techniques. Accordingly, it is often desirable to continuously monitor the quality of the fabrication process. If problems, such as defects and/or process excursions are encountered in the fabrication and detected quickly, the fabricator can take remedial action.

In general, there are two classes of techniques, before and after the wafer is fully exposed, to detect problems caused by the design and/or fabrication. One class takes place after completion of the semiconductor device fabrication sequence, where full-wafer (or chip) functional test and/or on the critical circuits of the device (at wafer-level or packaged chip) are performance-tested under pre-determined operating conditions. The other takes place during the fabrication process sequence, where some techniques rely on measuring certain parameters on the wafer. These parameters are indicative of, or otherwise capable of being extrapolated to be indicative of, possible problems or unanticipated outcomes from the fabrication process. These parameters may be determined by means of optical and electron beam techniques, including, for example, spectroscopic ellipsometry, reflectometry, and critical dimension scanning electron microscopy (CD-SEM). In one approach, measurements are made to verify certain physical parameters such as gate width, gate-oxide thickness, interconnect width, and dielectric height. Under such an approach, the measurements are normally made on test structures in the wafer scribe area, adjacent to the active portion of the chips.

Other techniques currently in use rely on measuring physical imperfections on the semiconductor wafer that result from the fabrication process. Examples of such techniques include blocked etch, via residues, gate stringers, chemical mechanical polishing erosion, and other process imperfections. These measurements may be made through optical inspection or review, electron beam inspection, and optical or electron beam review. By making such measurements, defects and imperfections formed during the fabrication of the wafer can be inspected, isolated, categorized, or otherwise reviewed and analyzed. These measurements typically cover the entire wafer and exclude the scribe area adjacent to the chip active area.

Still further, other approaches currently in use subject the wafer to electrical testing of specialized test structures that are positioned in the scribe portion of the wafer, or on parts and portions of the wafer that will not be used for the final product or test die in the wafer which again will not be used or fully processed for the final product. The testing is usually accomplished through the use of mechanical contacts for in-line (during fabrication) test probing.

Existing approaches have many shortcomings. Among these shortcomings, the techniques may require destruction of the semiconductor component, or have little value in indicating at what point the fabrication process failed or had an unexpected outcome. Additionally, the conventional inspection and review techniques have a high incidence of false counts, resulting from the presence of real defects that leave no electrical signature, and nuisance counts, which are caused by poor signal to noise ratio for very small defects. Also, these techniques cannot accurately predict the real-life and final electrical characteristics of the measured device or chip. Moreover, the existing electrical inspection techniques are very time-consuming and, therefore, cost prohibitive and they cannot be used to study large areas of the wafer in a routine manner.

Furthermore, the use of test structures in the scribe area provides little information on components in the active area chip areas of the wafer. For example, the scribe area is known to deviate from the micro-loading issues resulting from pattern density variation in the active area of the wafer, and as such, is not well suited for forecasting in-chip variations resulting from local process variation. Furthermore, the scribe area of the wafer is discarded during the chip sawing process and is not suitable, therefore, for measurements post fabrication.

There are numerous electrical in-line test methods to monitor the quality and integrity of the integrated circuit fabrication process. Such methods are based on predicting the performance of the completed integrated circuits, using the measurements obtained from partially processed wafers. For example, the thickness of the oxide film on the wafer can be determined through ellipsometric measurements. In addition, the aforementioned parametric measurements can be used to determine specific critical device parameters that are directly tied into the fabrication process. For example, one could use the threshold voltage to determine the doping levels of the diffusions. These parametric measurements are performed at various stages on the partially processed wafer. In a typical approach, the parametric measurements are performed specifically to measure physical and electrical parameters related to the process, and are performed on structures located in the wafer scribe area. Examples of parametric measurements include the measurements of transistor threshold voltage and off-current leakage. During these measurements, electrical and process tests constant (DC) voltage or small-signal (AC) voltage is applied to predetermined locations on the wafer to activate the device structures at several discrete locations across the wafer in the scribe area. In one specific technique, the integrity of the process is verified by comparing the values of the measured DC circuit parameters with a set of expected values.

In addition to some of the shortcomings described above, the electrical in-line test methods results are poorly suited for characterizing process parameters. For example, any specific observed deviation in one parameter of an integrated circuit may be caused by deviations in a number of process parameters. In addition, the conventional DC measurements are poor indicators of at-speed circuit performance. Most importantly, these parametric measurements are confined to the scribe area of the wafer, which as detailed above, is problematic.

Electrical test techniques that rely on large-area test structures are routinely used to understand full die effects that cannot be ascertained from wafer scribe test structures. In these applications, all (U.S. Pat. No. 6,281,696 and U.S. Pat. No. 6,507,942), or most (U.S. Pat. No. 6,449,749, U.S. Pat. No. 6,475,871, and U.S. Pat. No. 6,507,942) of the die are devoted to test structures that are measured in order to detect and isolate process defects contributing to low yield or low performance. These die are manufactured in place of product chip die and are physically probed to yield the process control information. While these techniques are useful to isolate random process defect types, they are only a substitute for direct measurements inside of the chip. They are difficult or impossible to integrate into the active area of a chip because they require physical contact to establish electrical contact, and because of the large real estate required to define the circuits used to isolate the defects, or in some cases, due to the large real estate required to catch low defect density defects. Alternately, some methods rely on the placement of similar structures inside of the active die area, but are placed there for post-packaged dies (U.S. Pat. No. 6,553,545). In this application, the structures are either tested through the package, or destructive failure analysis techniques are used to delayer the packaged die to get at the devices. For the systematic defect variation being addressed by the current application, measurements can be accomplished when the die are on the wafers, process modules with excessive intra-chip variation can be ascertained, no physical contact is necessary, and is small enough to integrate inside of the chip. Finally, other applications (U.S. Pat. No. 6,686,755) have explored the use of contact-less signal detection to probe chip functionality, where the chips are placed in conventional carriers and powered and stimulated through conventional contact probe techniques.

BRIEF DESCRIPTION OF THE DRAWINGS

FIG. 1A is a simplified block diagram of a system for obtaining evaluation information on how a wafer is fabricated, under an embodiment of the invention.

FIG. 1B illustrates locations on a wafer where measurements of performance parameters may be made.

FIG. 1C illustrates a chip on which performance parameter measurements are made for purpose of evaluating fabrication of a wafer and/or of the chip.

FIGS. 9A-9E illustrate different circuit elements that can be formed on the active portion of a semiconductor component and configured for the purpose of making time-delay or phase shift to exaggerate the performance sensitivity of these circuit elements to process steps.

Figure 9A:
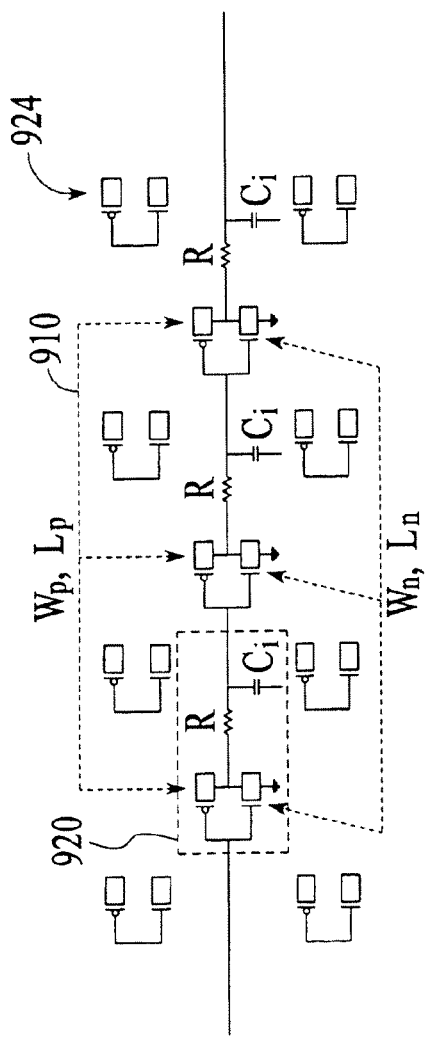

With regard to FIG. 9A, the circuit elements include length and width PSTS

Figure 9B:
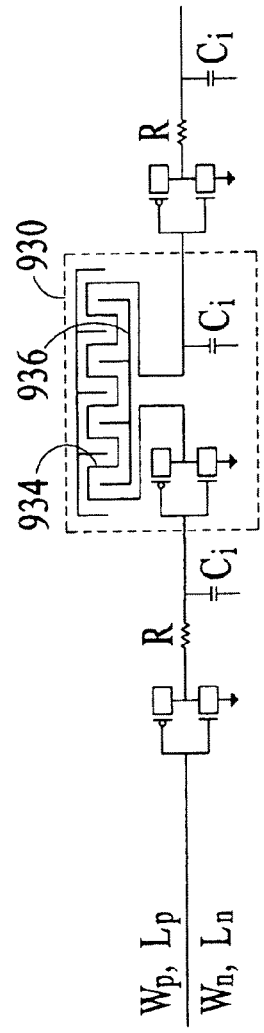
Figure 9C:
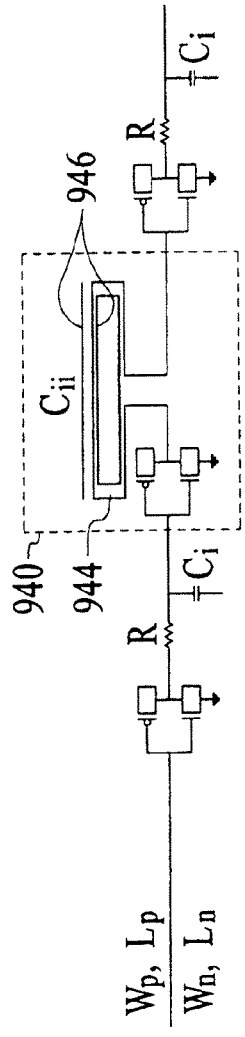

With regard to FIG. 9B, the circuit elements include interconnect resistance PSTS With regard to FIG. 9C, the circuit elements include interconnect capacitance PSTS.

With regard to FIG. 9D, the circuit elements include gate capacitance PSTS, with consideration for width/length rations.

With regard to FIG. 9E, circuit elements include gate capacitance PSTS, with consideration for use of equivalent capacitances.

Figure 10:
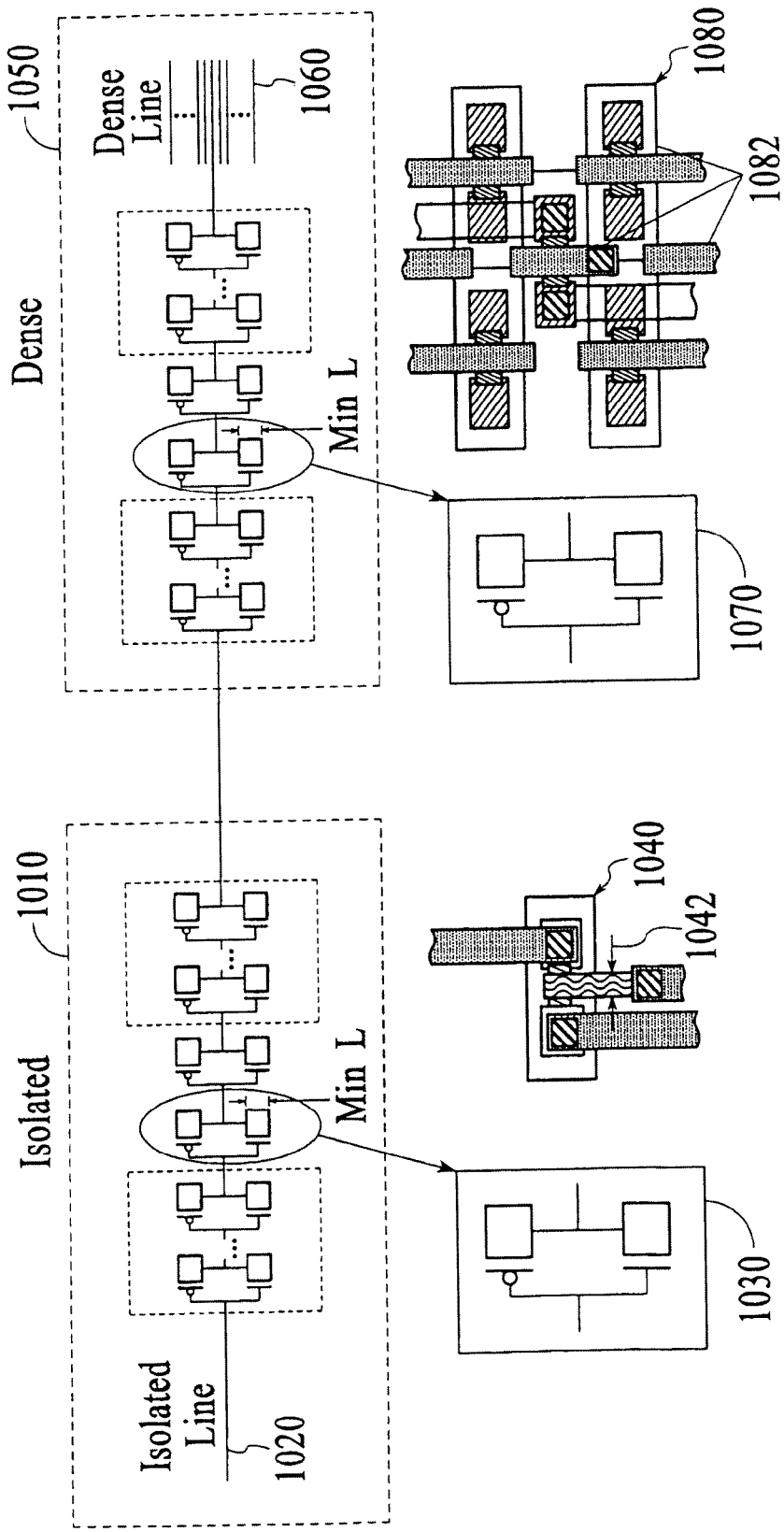

FIG. 10 illustrates a process-sensitive test structure that can be formed on the active portion of a semiconductor component and configured for the purpose of making time-delay or phase shift measurements to exaggerate and correlate the offset between CD SEM measurements and electrical CD measurements.

Figure 11:
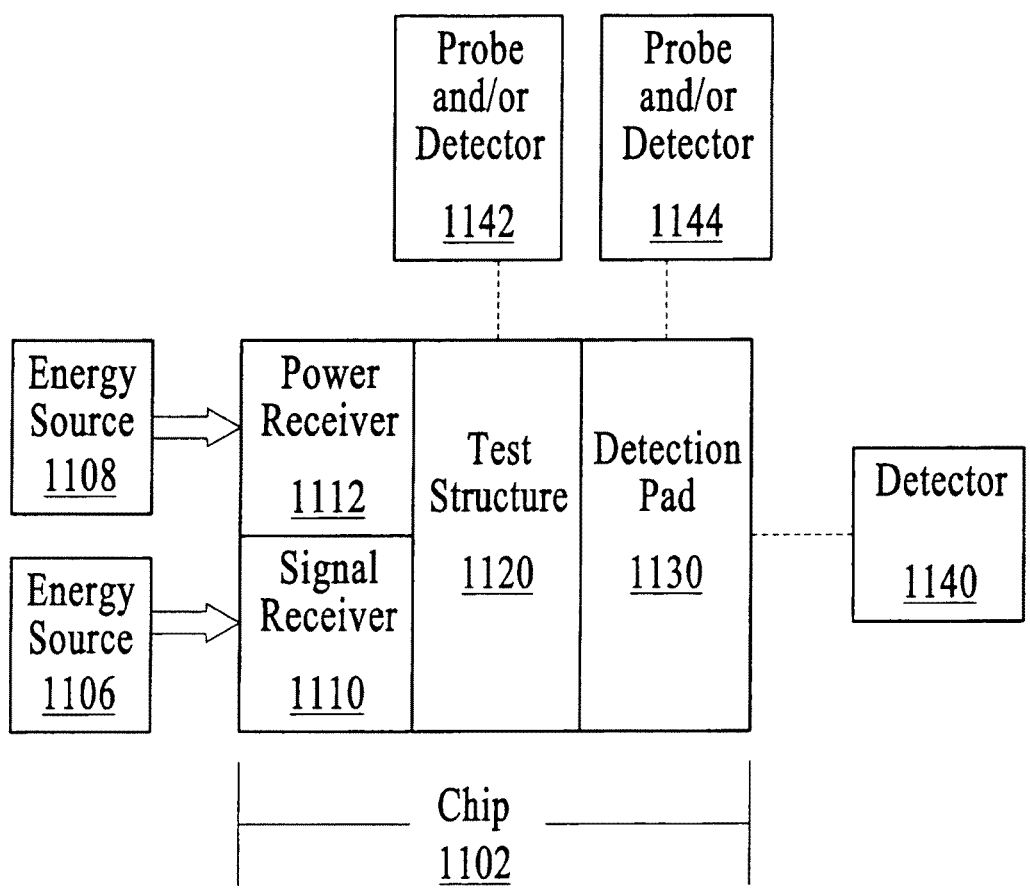

FIG. 11 is a representative block diagram illustrating a scheme to populate a partially fabricated chip with test structures that can then be used to measure performance parameters correlated with fabrication steps.

Figure 12:
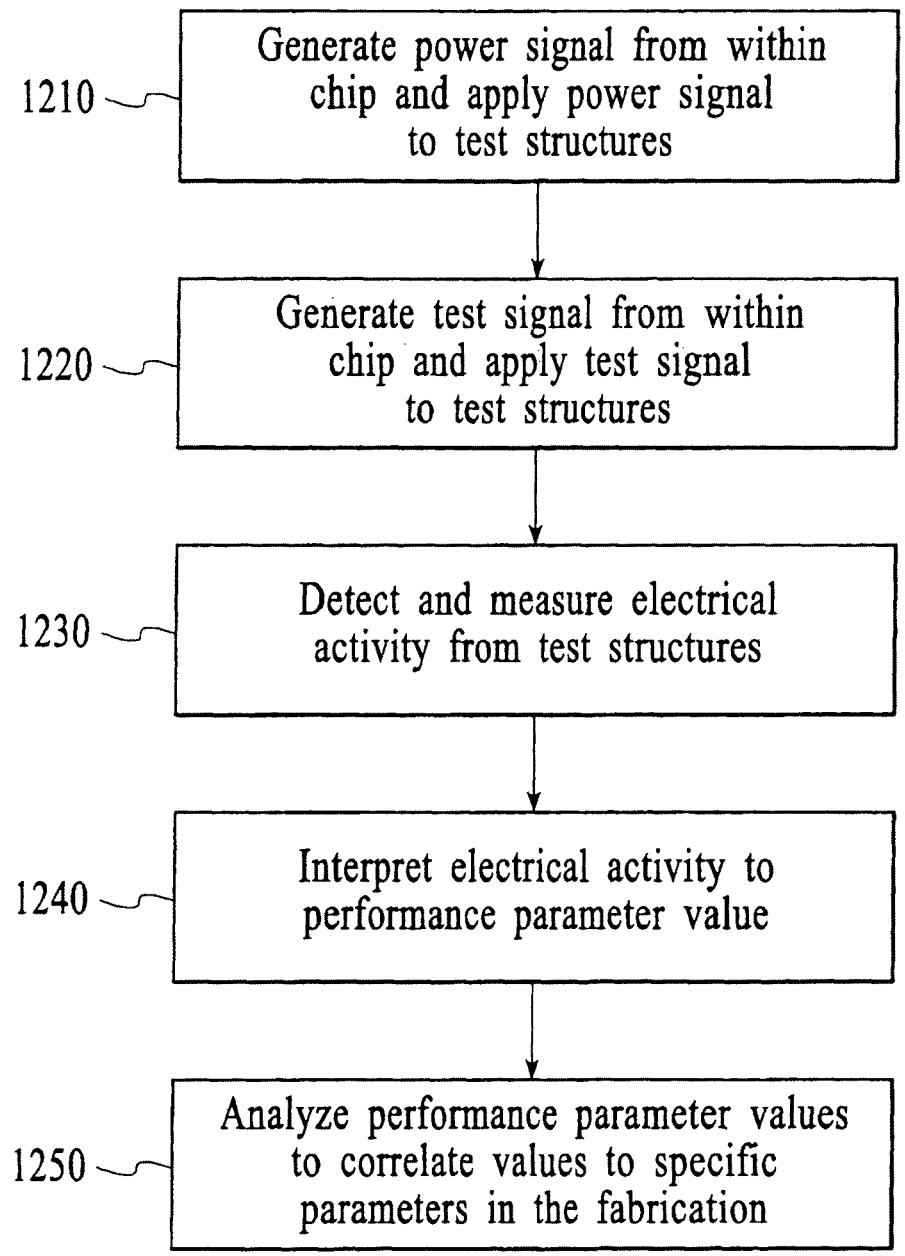

FIG. 12 illustrates a method for using a test structure when the test signal and power for that test structure are generated from within a chip on a wafer.

Figures 13A, 13B:
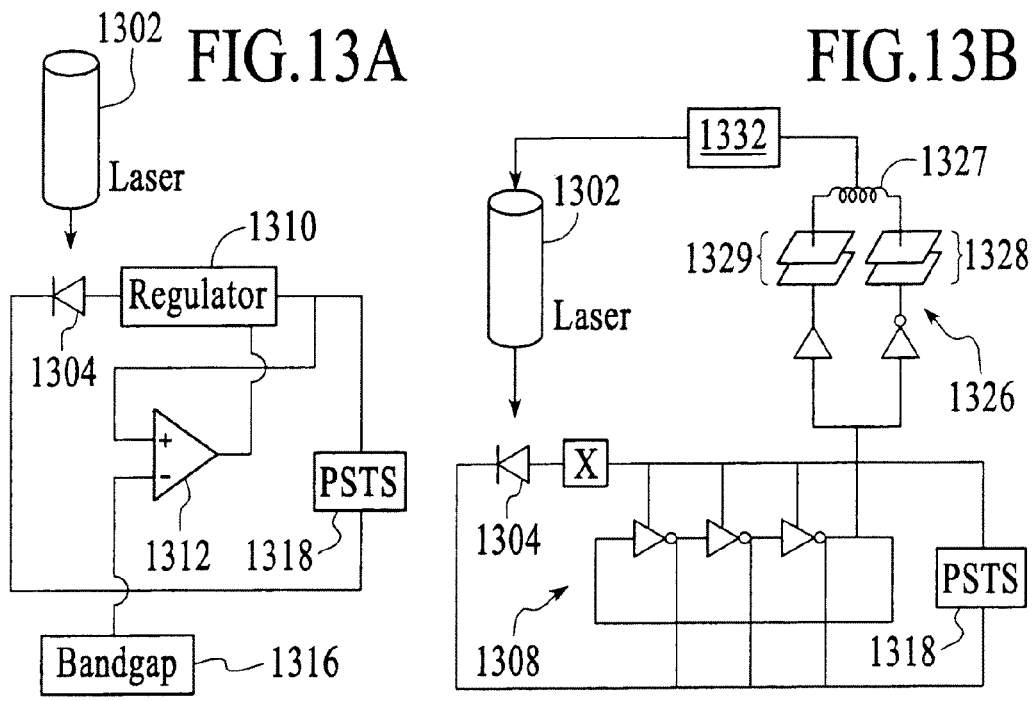

FIG. 13A illustrates a circuit for regulating an input voltage created by an external power source.

FIG. 13B illustrates a circuit for regulating an input voltage created by an external power source while enabling feedback to the laser source.

Figure 13C:
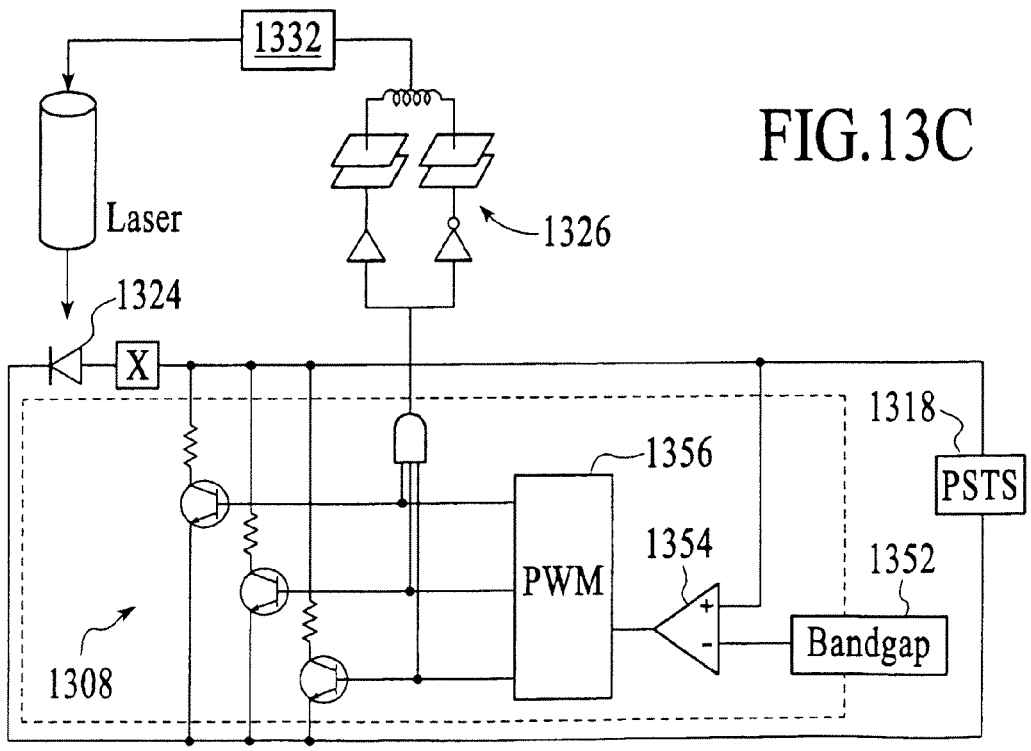

FIG. 13C illustrates a circuit for regulating an input voltage created by an external power source while enabling feedback to the laser source that can be co-located in the die active area with other components.

FIGS. 14A and 14B illustrate an embodiment in which a thermo-electric mechanism is coupled with a laser or other energy source in order to cause in-chip generation of a power or test signal.

Figure 15:
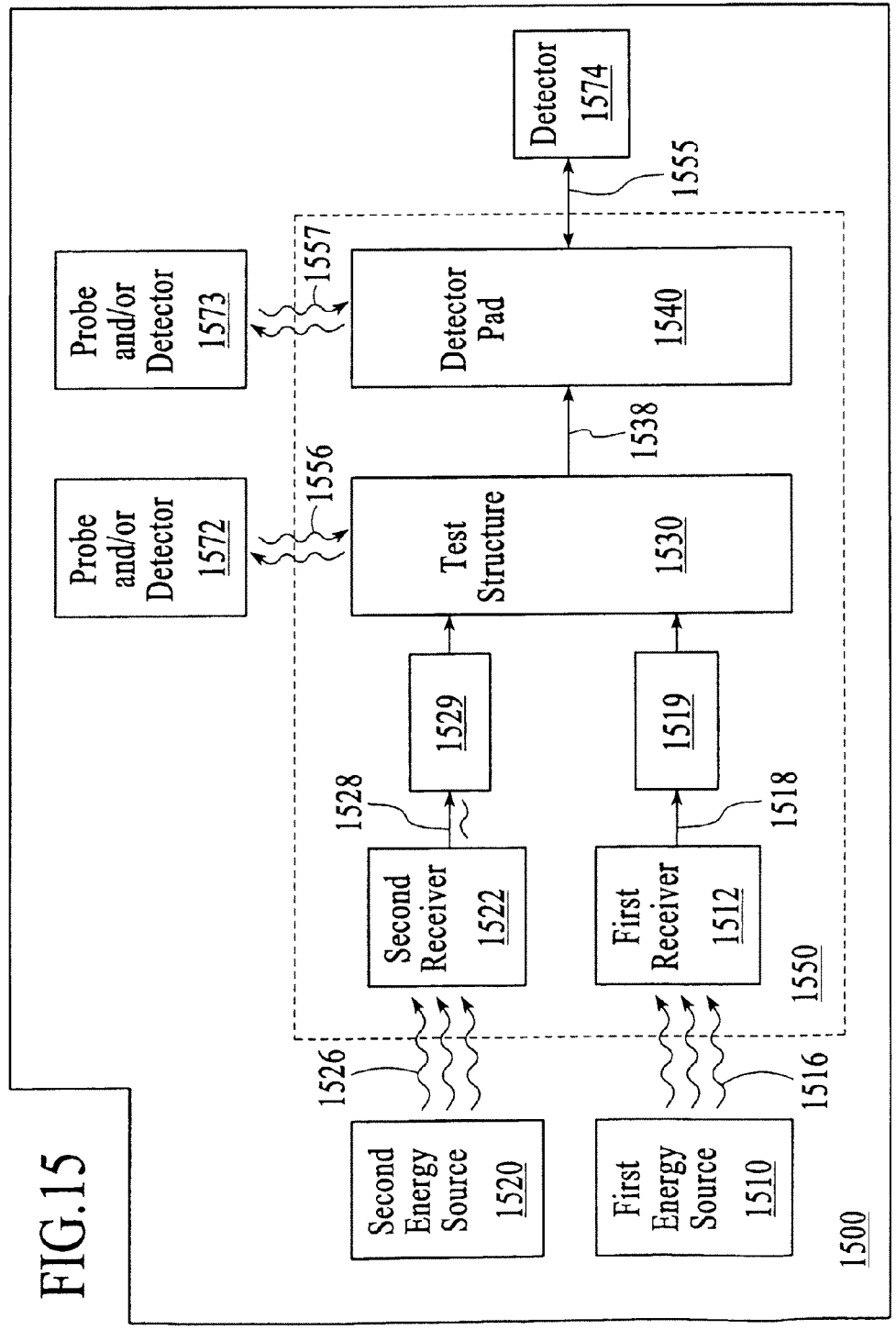

FIG. 15 illustrates a system for detecting and measuring electrical activity from designated locations on a wafer, according to an embodiment.

Figure 16:
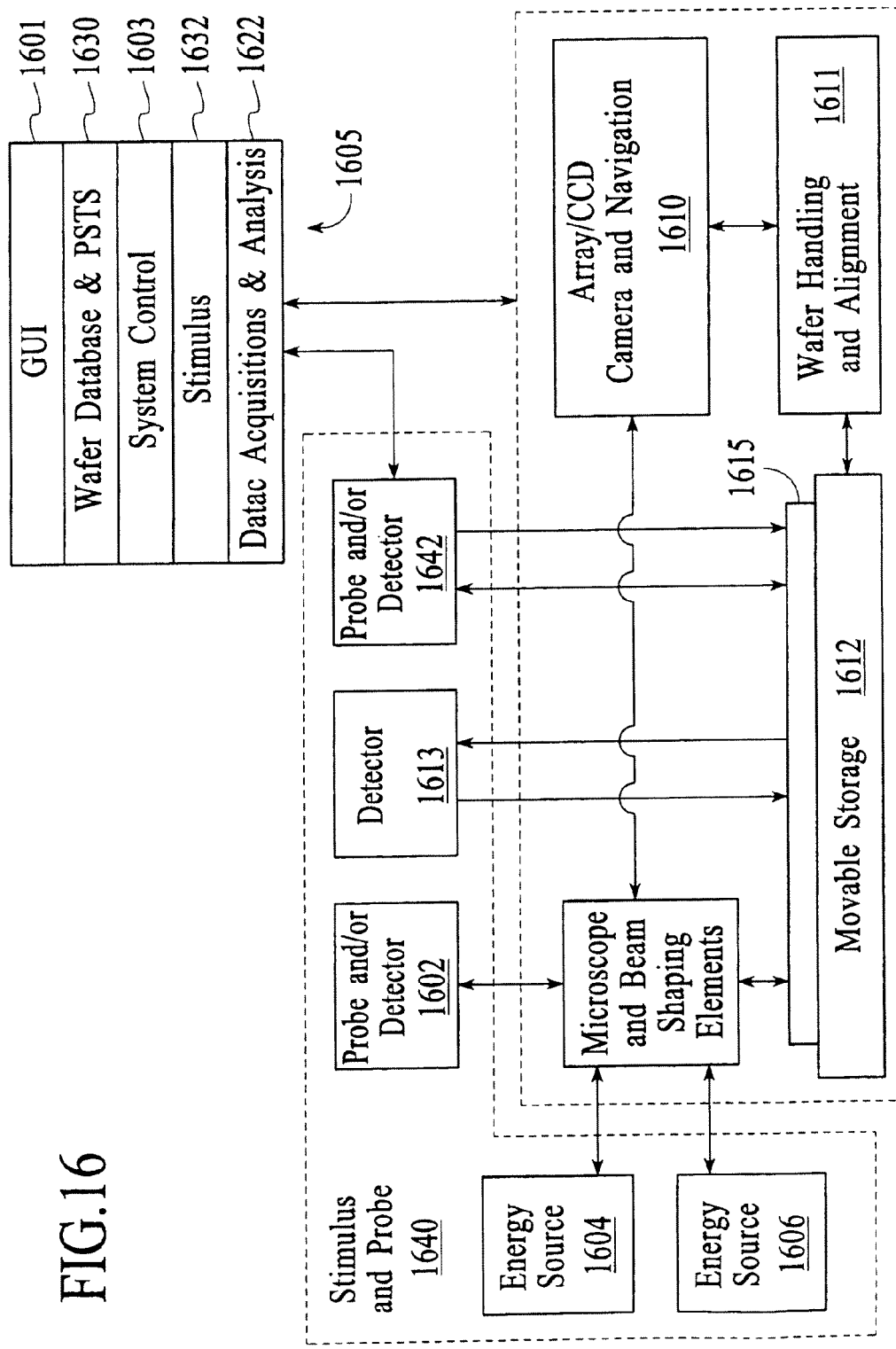

FIG. 16 provides additional details for an apparatus that induces and measures electrical activity from within designated locations of a chip, according to one embodiment of the invention.

Figure 17:
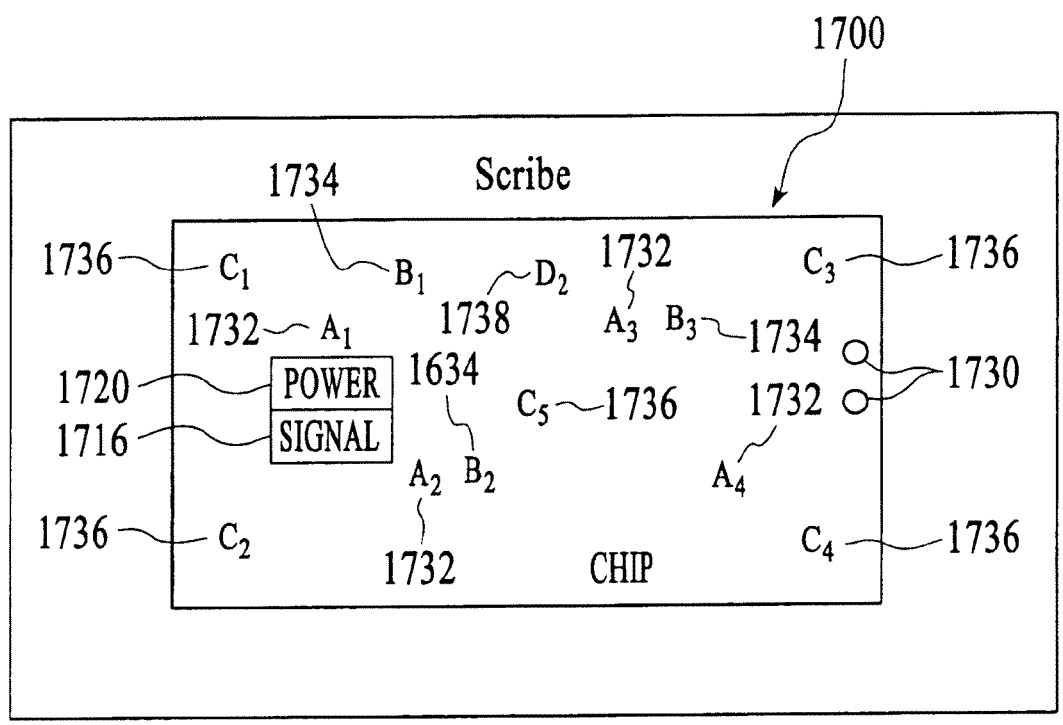

FIG. 17 illustrates a chip configured according to an embodiment of the invention.

Figure 18:
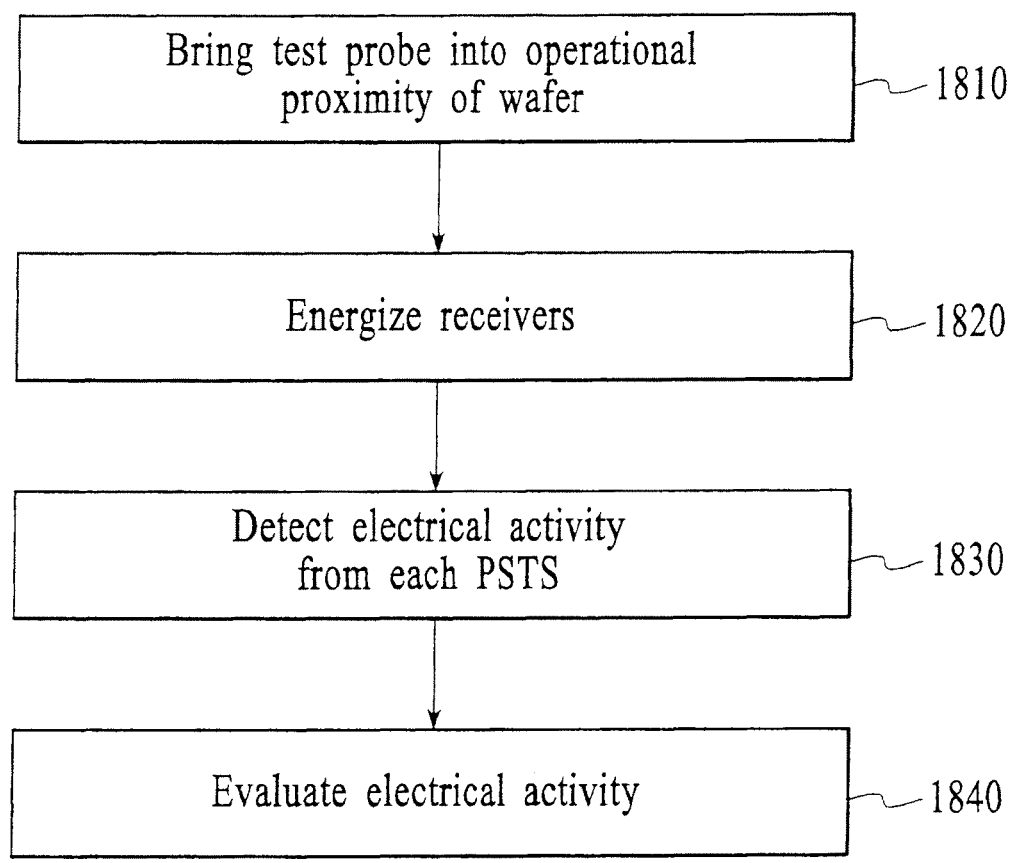

FIG. 18 describes a method for operating an apparatus such as described in FIGS. 15-16, according to one embodiment of the invention.

In the drawings, the same reference numbers identify identical or substantially similar elements or acts. To easily identify the discussion of any particular element or act, the most significant digit or digits in a reference number refer to the Figure number in which that element is first introduced. Any modifications necessary to the Figures can be readily made by one skilled in the relevant art based on the detailed description provided herein.

DETAILED DESCRIPTION

Overview

Embodiments described herein provide systems, methods, structures and other techniques for analyzing the fabrication of a wafer. In particular, embodiments described herein provide for obtaining information about how the wafer's fabrication is performed from numerous locations on the wafer with co-located power, test and detection structures, including from within the active regions of individual die that comprise the wafer. The information is obtained in a non-contact, non-invasive manner that does not affect the usability of the wafer and/or suitability of the wafer for subsequent wafer processing. The results and attributes of fabrication steps or sequences, including process variations that occur inside the active regions of the die or elsewhere in the wafer, may be detected, evaluated and/or analyzed.

Wafer Fabrication Evaluation and Analysis Using Performance Parameters

Embodiments of the invention provide for making in-chip measurements of certain performance-related parameters ("performance parameters") for purpose of evaluating the fabrication of a chip or wafer. The chip may correspond to the product that results when individual die of a wafer or diced and separated in a post-fabrication phase. Numerous chips may result from a diced wafer. The die corresponds to an area between scribe lines of a wafer. An active portion of the die is where active, discrete and integrated circuit elements that will be part of the chips' functionality may reside.

In one embodiment, a specific performance parameter is interpreted from, or otherwise based on an observed electrical activity occurring at predetermined locations within the chip or die of the wafer. A specific electrical activity may be induced or inherent to these designated locations and the performance parameter that is interpreted or based on the activity relates to a characteristic of the chip, die or wafer. Measurement variance of a plurality of these measurements is referred to as "variance". In an embodiment, a determination of performance parameters at designated locations is indicative of a characteristic of the die. Measurement variance of a plurality of these measurements in which the location of where the measurement was collected from is referred to as "spatial variance", and is often useful to identify, or fingerprint, a specific process step. In particular, the performance parameters are indicative of a characteristic of the device, die, scribe or wafer that is attributable to one or more of the processes in the fabrication of the wafer.

Because the performance parameters specify characteristics that are attributes of good performing chips or are attributable to one or more steps in the fabrication sequence, the measurements of the performance parameters provide information that is effective for evaluating the fabrication of the chip. For example, according to an embodiment, the measurements of the performance parameters may correlate to a portion of the die having a specific unwanted or unexpected result from the performance of a fabrication step or sequence. This result may be sufficiently isolated from other properties of the chip, such that the specific fabrication step or sequence that contributed to the value of the performance parameter may be identified. Furthermore, it may be possible to determine information about how the identified step or sequence performed from the value of one or more performance parameters in the chip.

According to one embodiment, electrical activity is induced from designated locations on the wafer. The electrical activity may be induced such that the interpreted performance parameter has a value that is exaggerated in the presence or absence of properties that result from one or more specific fabrication steps. As will be described, one manner for inducing electrical activity is to use specialized, process-sensitive test structures to process test signals. Numerous types of electrical activity can be induced and/or measured to evaluate fabrication, including for example, optical, optoelectronic, and radio frequency signals. In an embodiment, the use of such test structures may yield performance parameter values that are dependent almost exclusively on one or more fabrication steps, or at least on a distinct set of fabrication steps. Other embodiments may use non-test structures (such as product devices) known to produce, emit or exhibit specific properties as a result of certain physical attributes being present on the active portion of the chip.

According to another embodiment, electrical activity may be inherent at designated locations on the wafer, and performance parameters may be determined from the inherent activity which have correlation to the fabrication of the wafer. For example, a sensitive measurement apparatus may be used to measure performance parameters from circuit elements that would be used in the normal operation of the chip, where the measured performance parameters spatial variation can be correlated to a specific step or sequence. In these cases, the specific fabrication step or sequence that is correlated or otherwise identifiable from the measurement may be known to be the result of, caused by, or otherwise affected by specific process steps in the fabrication, or by a manner in which the fabrication was implemented.

FIG. 1A is a block diagram depicting an embodiment of the invention. In FIG. 1A, a probe apparatus 102 applies a stimulus 101 over designated locations of a wafer 110, and in response to the stimulus 101, detects and measures electrical activity 105 from the designated locations. The wafer 110 may be either partially or completely fabricated. The electrical activity may be detected with any one or more of the following: optoelectronic photonic effects and signals (e.g. hot electron photon emissions, charge-induced electro-absorption or electro-rectification), voltage contrast phenomena, electromagnetic signals (such as radio frequency or inductive signals), and/or other signals or affects that are detectable through a contact-less medium. As will be described, the electrical activity 105 may correspond to one or more chip-specific performance parameters 106. The detected and measured performance parameters 106 may be reviewed, analyzed or otherwise evaluated in order to determine a result, variation, or characteristic indicative of the quality of the chip, die and/or wafer, or one or more specific processes, steps, or process step sequences in the fabrication of the wafer 110. The detected and measured performance parameters 106 may also detect variation on different locations of the die or wafer that are induced by design density variations. According to one embodiment, the performance parameters yield information about some, but not all fabrication processes performed prior to the electrical activity being detected. Thus, such an embodiment enables specific fabrication processes that cause process variations to be identified and evaluated.

In one embodiment, probe apparatus 102 causes the electrical activity 105 to occur by directing a signal or an energy beam at the designated locations of the wafer 110. Designated elements on the wafer 110 may generate or exhibit the electrical activity 105 in response to this applied stimulus 101. The resulting electrical activity 105 is interpreted by probe apparatus 102 as one or more performance parameters 106. Examples of performance parameters that can be interpreted from electrical activity 105 include measurements of gate switching speed, propagation delays, phase shifts and/or slew rates, measured at the designated locations of the wafer 110.

An analysis may be performed to relate the performance parameters 106 to specific processes, process steps, and process step sequences, including tools or modules used to perform the processes and steps. This may involve analyzing location variations, or spatial variation, of attributes or results of specific fabrication steps or sequences on wafer regions, including on active regions of individual die. In an embodiment, the performance parameters may be used to obtain evaluation information 107 for evaluating a result, implementation, effectiveness, or performance of a fabrication step, sequence or process including how closely the results of the fabrication step or process were predicted. The evaluation information 107 may be based on comparing performance parameters values at different locations of the wafer 110, determining spatial or other kinds of variations in the performance parameter values over regions of the wafer 110, and other variances. More particularly, the evaluation information 107 and other analysis of the performance parameter values may involve comparing performance parameter values at different locations within the same chip, on internal locations of different chips, between scribe regions and one or more intra-chip locations, as well as other comparative points on the wafer 110.

A tool 109, such as a computer system, module, or software/systems program/module, may be used to perform the analysis that determines the evaluation information 107 from the performance parameters 106. The tool 109 may be part of a data acquisition system. In particular, the analysis may correlate the performance parameters 106 to characteristics of one or more fabrication steps 108 or processes. For example, tool 109 may correlate the performance parameters 106 to fabrication steps that result in and from the presence of resistivity and capacitance variations in metals, or to the presence of variations in gate lengths and trench shapes. In addition, the identification of fabrication steps 108 may implicate a module or tool used in performing that fabrications step. As such, identification of fabrication steps 108 that are consistent with the analysis of the performance parameter indicates, or yields other evaluation information 107 that can be used to determine aspects of the overall fabrication process. The evaluation information 107 may include any data that, either by itself or in combination with other data or information, is informative as to how one or more fabrication steps were performed. For example, the evaluation information 107 may be statistical in nature, so that multiple wafers are fabricated before a statistical distribution derived from the evaluation information is indicative of a process variation or other aspect of how certain fabrication steps or processes were performed. As another example, the evaluation information 107 from one region of one wafer may be determinative of how a particular fabrication step or sequence was performed. The evaluation information 107 may also include calibration data, which can be used to gain perspective of other evaluation information. Because the evaluation information 107 may be derived from any location on wafer 110 (including as described in FIG. 1B, within the active region of a die), an embodiment provides that process variations and faults that affect in-chip devices may be more readily identified. However, the evaluation information 107 may also be used to identify fabrication steps that were performed adequately, in order to isolate other fabrication steps that are problematic through elimination.

FIG. 1B illustrates how fabrication may be analyzed on different regions of the wafer 110, according to an embodiment. In FIG. 1B, wafer 110 is assumed to be in a partially fabricated state. The wafer 110 includes a plurality of scribe regions 121 that define a plurality of die 127. A dicing channel 125 may also be formed in the scribe regions 121 in between rows and columns of die 127. Each die 127 may include an active area 128 (e.g. chip) and an inactive area 129. The scribe lines 123 serve as boundaries between adjacent die 127.

According to an embodiment, electrical activity may be observed on designated locations of the wafer 110. These designated locations include scribe line locations 134, die channel locations 135, active die locations 136, and inactive die locations 138. The scribe line locations 134 may be sufficiently proximate to the active area 128 of the corresponding die that those scribe line locations 134 fall within the residual die material of the chip, after the wafer 110 is diced. In an embodiment, the designated locations may also include active die locations 148 of perimeter die elements 146. The perimeter die elements 146 often are "throw-away" elements, as their presence on the edge of the wafer prohibit full functional operation of that die as a chip. However, embodiments described herein use the perimeter die elements 146 to measure performance parameters, and to evaluate fabrication, particularly on locations of the wafer 110 that approach the wafer's perimeter.

In an embodiment, electrical activity 105 is detected and interpreted as a particular kind of performance parameter at locations that include scribe line locations 134, die channel locations 135, active die locations 136, inactive die locations 138, and/or active die locations 148 of perimeter die 146. Comparisons of the different performance parameter values may be made in order to determine evaluation information. For example, comparisons of performance parameter values may be made amongst active die locations 136 of the same die 127 in order to determine process variations on that region of the wafer 110. The comparisons of performance parameter values may also be made amongst active die locations 136 of different die, amongst or between inactive die locations 138 and active die locations 136 of the same or different die, and amongst scribe line locations 134. In addition, certain comparisons of performance parameter values may be made between scribe line locations 134 and adjacent active die locations 136 for purpose of calibrating evaluation information, and other purposes. Active die locations 158 of perimeter die 146 may show how specific fabrication steps were performed on the periphery of the wafer 110. On occasion, process variations could be more severe on the wafer perimeter.

In an embodiment, electrical activity 105 is induced to occur, at least to the levels detected and measured, in a manner that enables performance parameters derived from the electrical activity to be exaggerated (e.g. amplified or filtered), depending primarily on one or more steps in the fabrication of the wafer 110 at the particular location where the performance parameter is measured. Thus, the performance parameters determined from the electrical activity 105 represent an underlying fabrication characteristic of the individual die 150 and/or wafer 110. There may be hundred, thousands, or even more such measurements made on any particular wafer 110. Furthermore, such measurements may be made repeatedly, after completion of one or more fabrication processes. It is also possible to use the same exact locations to repeatedly measure for performance parameters. Furthermore, in contrast to past approaches, performance parameters are determined from measurements of electrical activity at active die locations 138 of wafer 110, as opposed to physical measurements and/or electrical-tests conducted in the non-active areas of the chip or off-chip/die in the scribe. The present technique allows direct measurement of performance parameters in the active area of individual die, in contrast to physical measurements in the active area which at best infer indirect correlation to the final performance of the device and chip, and thereby the process robustness. Embodiments then relate performance parameters and their variations to isolated process step(s) and/or sequence(s).

Different values of performance parameters may be evaluated or analyzed in order to obtain information, an indication, or even an identification, of specific processes in the fabrication of the wafer 110. These processes may result in, for example, a particular physical or electrical property, and the presence of this property at a particular location may be reflected in the value of the performance parameter. In one embodiment, the value of each determined performance parameter is primarily dependent on the performance of a fabrication step or process. Alternatively, a correlation may be made between a performance parameter and a fabrication characteristic that is known to be related to a particular fabrication step, process or technique. The values of the performance parameter at different locations on the wafer may be analyzed to determine an understanding of how the fabrication characteristic exists on a particular chip. This understanding may then be used to evaluate the related fabrication process, including determining how that process was performed, what results it yielded, and whether the results matched what was intended.

FIG. 1C illustrates how performance parameter values may be used within the confines of a die in order to evaluate fabrication of the die and/or its wafer. In FIG. 1C, die 150 includes an active region 152 and an inactive region 154. Different classes of performance parameters may be identified and measured on the die 150, and in particular, in the active region 152. This is in contrast to some conventional approaches, which take measurements of performance parameters only in the scribe. In one embodiment, each class of performance parameter corresponds to one or more fabrication steps, processes or characteristics. Different classes of performance parameters may be measured from the wafer die 150 by inducing electrical activity of a specific type from designated locations of the die.

Performance parameters may be analyzed by determining a variance amongst multiple performance parameters measured from the die 150 at different locations. In one embodiment, a spatial variance is determined for a particular class of performance parameters disposed within the active region 152. In another embodiment, the analysis involves comparing performance parameters of different classes, such as in the case of electrical activity resulting from structures disposed on die 150 and having different designs and/or configurations. For example, a spatial variance of the values of a class of performance parameters is used to determine information about the fabrication processes used to form the die 150.

Still further, different classes of performance parameter measurements may be used to formulate a performance map of the die 150. The map may provide an indication of a value or presence of different fabrication characteristics on the die 150. As such, the map may provide information for evaluating numerous processes in the fabrication of die 150 or its wafer, both before and after their respective fabrication completions.

The locations of the die 150, or its wafer 110, in which performance parameter values are measured may be provided mechanisms, structures, and/or integrated circuit elements that exaggerate performance parameter measurements based on the presence or absence of one or more characteristics of fabrication steps or processes. In one embodiment, the value of one performance parameter may be primarily attributable to one fabrication step, or a particular subset of the fabrication steps.

In an embodiment such as shown by FIG. 1C, designated locations of the die 150 are selected for purpose of making measurements of performance-related parameters. The designated locations are labeled in sets ($A_1$-$A_n$, $B_1$-$B_N$ ... $D_1$-$D_n$, etc.). At each set (e.g. $A_1$-$A_n$), a particular performance parameter is measured, where each performance parameter in the set is based on a particular kind of electrical activity. Each set of performance parameters may correspond to a class, in that the measurements are made from structures having a common design or feature, and/or yielding the same fabrication step dependence. In particular, each class of performance parameters may be measured from electrical activity that is induced or designed to accentuate one fabrication step or sequence over other fabrication steps/sequences. In fact, this electrical activity can be induced or designed to be independent of other fabrication steps, so that the performance parameter interpreted from that electrical activity is dependent almost exclusively on one (or possibly more) fabrication step(s) or sequence(s). In one simplified example, a common test structure may be disposed in the active region 152 of the die 150 and activated by a stimulus and/or other signal. A resulting electrical activity may be detected and measured as one of the performance parameters in the set $A_1$-$A_n$. In one example, if the fabrication of the wafer is uniform, there is no discernible difference in value amongst the performance parameters in the set. If, however, there is a spatial process variation, then there may be discernable differences (perhaps in the form of a gradient or trend) amongst the performance parameter values. Performance parameter values from the inactive portion 154 of the die 150 may also be used, particularly for other purposes like providing a baseline or calibrative set of values for the performance parameter values in the active region 152.

In an embodiment, the value of each performance parameter may be interpreted from electrical activity that results from inducing and/or simulating a specialized test structure. The structures may be designed to exhibit performance parameters in direct relation to one or more fabrication step or sequence on the die 150. Furthermore, the design of the specialized structures may be such that there is no dependence in the value of the exhibited performance parameters on other fabrication steps or sequences in the set.

For example, one class of structures that generate a particular signal on activation may be used to determine a particular performance parameter value that is known to amplify or otherwise be out of a range in values in the presence of a specific fabrication characteristic (e.g. capacitance or gate length variations that exceed a certain amount). In the same example, the design of the structure may minimize or filter out the effects of characteristics of other fabrication steps or sequences in that such characteristics may have a relatively small or insignificant effect on the value of the performance parameter. As another example, the performance parameters may correspond to electrical activity measured from a device that yields a high-value for that measurement when extra metal, or capacitance caused by too much metal, is present on the chip.

The relationship between the performance parameters and the identified fabrication steps or sequence may be based on a variance of the measured performance parameters. The variance may be based on space, speed, or other variables affecting the performance of the particular die 150.

Various advantages may be provided by an embodiment such as described with FIGS. 1A-1C. Among these advantages, determining performance parameters that are closely related to fabrication steps enables engineers, designers, and yield managers to identify certain fabrication steps (including tools or modules used in the steps) that are problematic before the fabrication is completed. This allows the processes and techniques used in the fabrication to be studied and improved upon in a more effective manner. For example, flaws in one process of the fabrication may be detected and improved upon in between fabrication of individual wafers. Each subsequent wafer may then turn out a better yield. For example, in the past, design flaws often resulted in some chips on the wafer being marketed as a lower performance product, rather than being marketed at the performance level that was intended. This reduces the value of individual chips considerably. Under traditional approaches, the evaluation of wafer fabrication was an expensive and time-consuming process, often requiring numerous samples for statistical analysis. In contrast, embodiments of the invention enable "on-the-fly" detection of fabrication problems, and an opportunity to correct specific fabrication processes before fabrication of another wafer occurs. While statistical analysis may still be used, embodiments of the invention enable the statistics to isolate specific fabrication processes at a much quicker rate than previous approaches. Furthermore, the data is determined from within the die of the wafer, so that the problems in the fabrication processes are better detected and understood. Also, the monitoring, detection, isolation and analysis are done in-line and during the process where corrective and measures and appropriate adjustments could be made.

Figure 2:
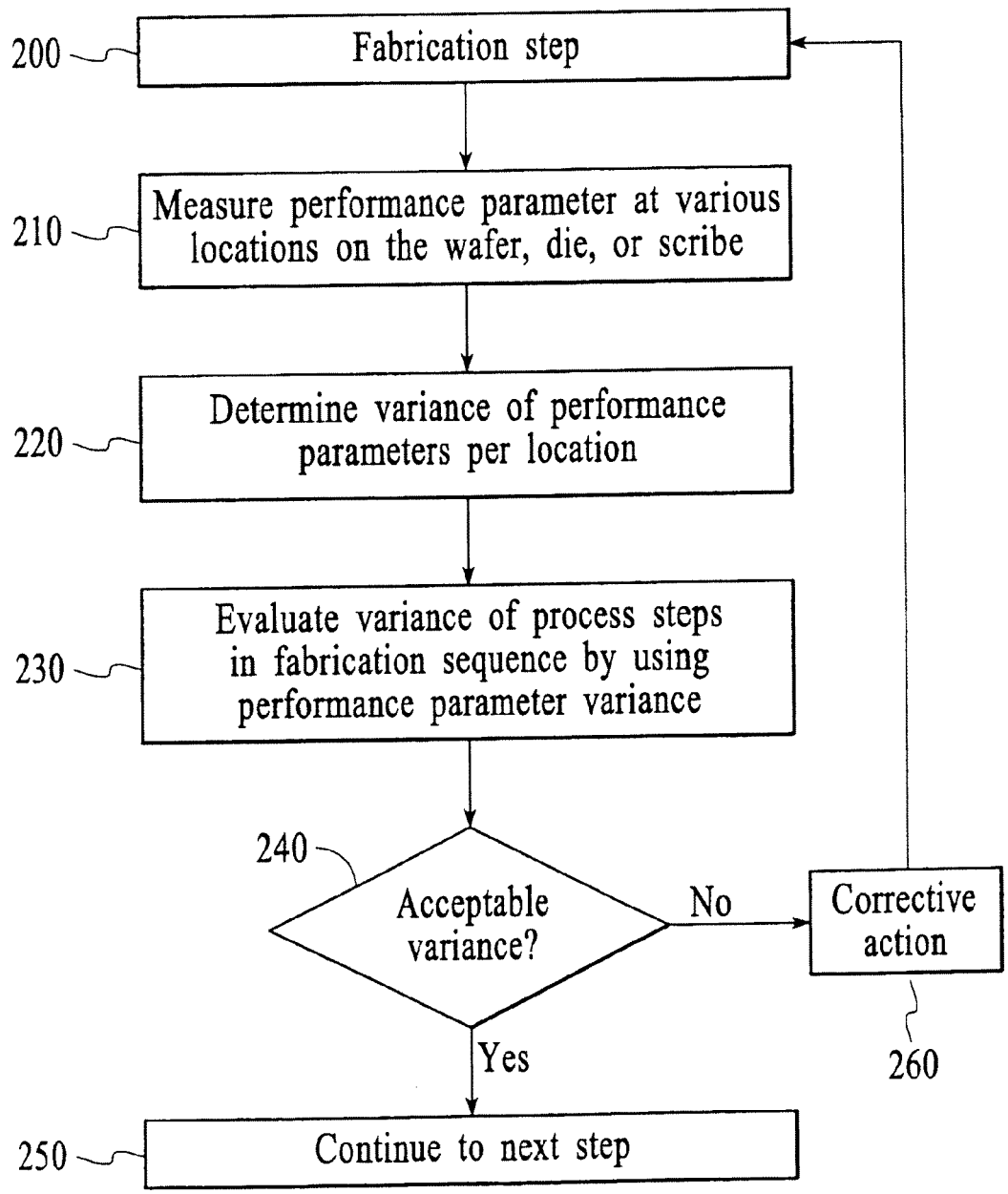
FIG. 2 illustrates a method for evaluating how process steps in a fabrication of a chip are performed, under an embodiment of the invention.

FIG. 2 illustrates a method for evaluating a fabrication of a wafer, die or chip, under an embodiment of the invention. A method described with FIG. 2 may be performed in conjunction with the use of measured performance parameters, such as described with FIGS. 1A-1C. As such, reference to numerals in FIGS. 1A-1C are intended to illustrate a suitable context for performing such a method.

Initially, in step 200, a wafer has completed one or more fabrication steps or processes. Next, step 210 provides that performance parameters are measured at various locations of a wafer 110, including within the active regions 152 of the die 150. For example, probe apparatus 102 may be used to make in-chip measurements of electrical activity at various locations. Mechanisms, such as test structures, that are designed or otherwise known to exhibit electrical activity from which performance parameters may be determined are positioned selectively within the die 150. The performance parameters may be measured by activating such mechanisms with energy, stimulus and/or test signals, and furthermore, by detecting (measure) the electrical activity by non-contact electrical, optoelectronic and/or electromagnetic means from predetermined locations within each element and/or output signal pads.

Step 220 provides that the variance of performance parameter values measured in step 210 is determined. In one embodiment, the variance is spatial, and may be apply across the wafer 110 and die 150, including the die's active region 152. A spatial variance of such values indicates how the value of the common performance parameter (e.g. an output from a common test structure, or a detected emission from a specific on-chip component) changes from one location to another, whether the designated location is in-die or distributed amongst numerous die and scribe regions 121. Alternatively, the variance may be based on some other parameter, such as switching speed or slew rate.

In an embodiment, the spatial variance of a measured performance parameter provides an analysis tool for isolating specific fabrication-related properties that adversely and/or unpredictably impact chip performance. With respect to in-die analysis, the performance of each die may be characterized as a function of numerous independent factors, where each factor is based on a physical attribute of that die. The performance of a fabrication process or step, which yields a spatially variant physical property across the die 150 or its wafer 110, is an example of a process variation.

According to one embodiment, step 230 provides that spatial variances of specific physical properties on the wafer 110 and/or die 150 caused by process variations are used to evaluate how the wafer 110 is fabricated. The performance parameters may be measured from electrical activity that is induced or designed to exaggerate the affects of specific process variations. An analysis of this principal may be provided as follows. Consider a function F describing the circuit performance P of a device. The performance P is dependent on a number of physical parameters that describe the geometry and electrical properties of the materials used in the fabrication sequence:

$$P=F(L,W,T_{ox},I_{SDE},\ldots),\qquad(1)$$

where, for example, L and W are device gate length and width, respectively, $T_{ox}$ is the gate oxide thickness, and $I_{SDE}$ is the source-drain extension implant dose. P is also dependent on other parameters such as interconnect parameters, which are omitted here for conciseness. A fabrication process variation, which corresponds to a variance of a physical property produced by that process or step, induces a measurable variance in P that can be approximated to first order by:

$$\Delta P|_{s,l} \approx \partial F/\partial L \cdot \Delta L|_{s,l} + \partial F/\partial W \cdot \Delta W|_{s,l} + \Delta T_{ox}|\Delta T_{ox}|_{s,l} + \ldots \qquad(2)$$

evaluated after a specific process step s and at a specific location l, and where $\partial F/\partial X$ is the response of F to the influence of variable X (L, W, etc. . . . ).

The equation provides that a variance of a performance of devices on the die or chip may be expressed as a function of the variance of certain attributes or results from steps of processes in the fabrication of the wafer where the variance is evaluated after a process step or location or both. The features on the wafer 110 or die 150 that cause the electrical activity from which performance parameter are measured may each be selected and structured so that only one of the parameters is sensitive to a specific process variance at a time. This means that the variance of the common performance parameter will be proportional, or at least have some direct relationship to, to the corresponding process variance. For example, a process variation may be location based, in that a process is not uniformly performed over a region or entirety of a wafer. There may also be a variation in how a step is performed in the fabrication of one or more wafers.

In an embodiment, step 230 includes associating a property or characteristic of a fabrication step with the spatial variance of the performance parameter. This step may be done before or after the measurements are made.

In an embodiment, a determination is made in step 240 as to whether the indicated process variations are acceptable. If the process variations are acceptable, the fabrication of the wafer 110 is continued in step 250, and other fabrication steps or processes are performed. If the process variations are not acceptable, then corrective action is taken in step 260. The corrective action may be in the form of repeating process steps of step 200. Alternatively, the corrective action may correspond to stopping the fabrication, or modifying the performance of one or more fabrication steps for subsequent wafers. Alternatively, the corrective action may allow the fabrication to continue, but under a monitored state where data for correcting the fabrication is collected and analyzed. It may also be the case where a fabrication characteristic goes undetected until the end of the line. Rather than repeating the excursion for the next line, the operator can assess fabrication steps or processes that require minor modification, so that the excursion would be eliminated or reduced going forward.

As an alternative to determining spatial variances, other types of intra-die excursions may be identified. For example, embodiments of the invention may detect an unacceptable result or attribute of a fabrication step that is uniformly distributed through the entire wafer or die.

Figure 3:
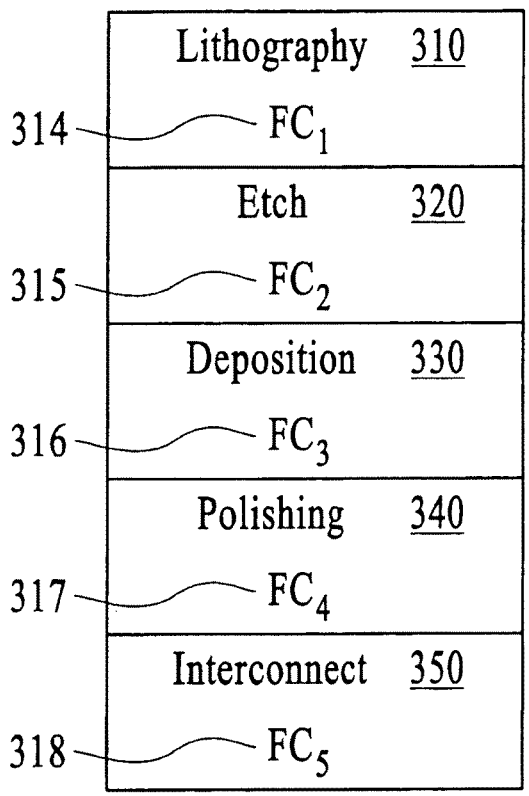
FIG. 3 illustrates process steps which may be evaluated based on corresponding fabrication characteristics that are associated with measurements of performance parameters within the chip.

FIG. 3 is a block diagram that illustrates how performance parameters, measured from within the chip or die in the wafer, may be used to evaluate the implementation of some basic steps or processes that are used in the fabrication of a semiconductor wafer. While there are several other kinds of processes that are normally performed in fabrication, FIG. 3 illustrates a lithography process 310, an etch process 320, a deposition process 330, a polishing process 340 (such as chemical-mechanical polishing), and an interconnect process 350. These processes form some of the overall process used in the manufacturing of a semiconductor wafer. The processes shown in FIG. 3 may be performed in various different orders and repeated, as required by a particular fabrication protocol or recipe.

According to an embodiment, one or more of the fabrication processes or steps may be associated with a set of one or more characteristics 314-318. The fabrication characteristics 314-318, including results and/or attributes from the performance of one or more fabrication steps, associated with two or more processes may overlap. The fabrication characteristics 314-318, when considered individually or in combination with other fabrication characteristics, may correspond to a feature or aspect on the wafer or die that identify how the processes or steps associated with those fabrication characteristics are performed, particularly in view of the other fabrication processes. The fabrication characteristics 314-318 are determined from performance parameter measurements. It follows that each of the processes illustrated in FIG. 3 may be evaluated by measuring performance parameters from electrical activity observed at designated locations of a wafer 110 (including in the die or scribe regions). Values of these performance parameters may be evaluated or analyzed to relate to particular fabrication characteristics. The fabrication characteristics may then be related to processes such as illustrated in FIG. 3, or sub-processes thereof.

The measurements may be made either during the fabrication, or after completion of the fabrication. In some cases, the performance parameters can be measured after the first metal layer has been deposited on the wafer 110. In one embodiment, measurements of performance parameters are made repeatedly after completion of certain processes, beginning with completion of the first metal layer. In an embodiment the iterative process could allow the operator to observe and monitor variations of performance parameters at the same location(s) through and at each step of the process, and take remedial actions to adjust according to expected results for better yields and performance.

In an example provided with FIG. 3, a function of the set A of performance parameters (see FIG. 1B) within an individual die of the wafer may be used to evaluate the lithography process 310 and etch process 320 in the fabrication. For example, the function of the set A may yield a variance, value or other indication of a fabrication characteristic that is known to be the result of the lithography process 310 and etch process 320. Similarly, a function of the set B of performance parameters may be used to evaluate the deposition process 330, a function of the set C of performance parameters may be used to evaluate the polishing process 340, and a function of the step D of performance parameters may be used to evaluate the interconnect process 350. This description is only an illustrative example and many variations are possible. For example, it is possible for one function of performance parameters of one kind to be used jointly with another function of performance parameters of another kind to evaluate one or more steps in the fabrication. How results of particular functions may relate and provide information on a particular fabrication process may range from the simple (the value of a particular fabrication characteristic is exceeded or the parameter variance is not within specified limits) to the more complex (in-chip variance of one fabrication characteristic is unacceptable in view of the in-chip variance of another fabrication characteristic).

Similarly, various functions may be implemented on a set of performance parameters. In an embodiment such as shown in FIG. 3, a mathematical function, such as Equation 2, is used on measured values of a particular performance parameter at different locations in the die of the wafer in order to isolate one type physical property (or other fabrication characteristic) from another type. The fabrication characteristic is isolated to correspond to one of the processes shown in FIG. 3. Other types of functions are possible. For example, one function may require that measured performance parameters on individual die to be compared to one another and to the highest performance parameter value on the wafer. Another function may require that one or more of a set of measured performance parameters (e.g. $A_1$ in the set of A) be compared to a known, expected or desired constant. If the comparison is unfavorable (e.g. beyond the expected and/or acceptable range), evaluation information about a corresponding step may be determined.

It is also possible for two functions to be performed on one set of parameters to identify evaluation information for different or the same processes. For example, lithography process 310 may be evaluated by the parameters of set A, using and algorithm to determine the composite of A within the die. In addition, each performance parameter value is compared to a designated constant for favorable comparison. In this example, each of the two functions provides evaluation information on how a particular fabrication process is performed.

To provide another example, a variance of each performance parameter in a class may be compared to a variance of a baseline class. The baseline class may be based on performance parameters that have do not show variance to any particular fabrication step or location.

The functions performed by the different performance parameters may be applied to die or wafer-level analysis of the fabrication. To apply to a wafer-level analysis, the performance parameter value may be measured from different die on the wafer 110.

Some specific examples of performance parameters, and how they relate to processes in the fabrication of the wafer 110, are provided as follows. A performance parameter may correspond to a measurement of resistivity. Chip performance may be adversely affected, for example, when the polishing process 340 is performed on the wafer 110 resulting in extra, or non-uniform, polishing—or thinning—in high-density regions of the die within the wafer increasing the effective resistivity of the interconnects in those regions. In an embodiment, circuit elements that are sensitive to interconnect resistivity fluctuations (either exceptionally high or low) may be planted or located on the die to determine whether the chip or wafer has unwanted resistivity variation. The output from these circuit elements may be viewed to determine how resistivity causes delays in the output. In particular, these elements may be planted or located in areas where high-density or low-density of circuit elements exist, and where deviations in resistivity are thus more likely. By measuring output from a circuit element that accentuates resistivity, it is possible to isolate on that element the chips's and wafer's resistivity property, at least at or near the location of that circuit element. As an example, one or more functions may be formulated that incorporate a spatial variance of the resistivity and/or a comparison of measured values of resistivity to known or desired values. Common structures that accentuate the presence of unwanted resistance, but otherwise should have nearly identical switching speeds when disposed on the die, may be used to evaluate how much unacceptable variance in resistance is on the active area. In this way, parameters that indicate resistivity of a particular region on the die may provide evaluation information about, for example, the polishing process 340.

Another example of a performance parameter a measurement of timing delays and/or switching speeds to a circuit element that has extreme capacitance values. The presence of unwanted capacitance may have an exaggerated effect on such circuit elements. By measuring switching speeds of circuit elements that are grossly affected by unwanted capacitance, a composition of values or formula may be developed for purpose of evaluating one of the process steps. For example, metal deposition in process 330 may be evaluated based on switching speeds of circuit elements that are used to detect capacitance.

Process Sensitive Test Structures for Evaluating Fabrication Processes

Process-sensitive test structures (PSTS) refers to structures that are sensitive in electrical performance under stimuli to a particular step and/or sequence of steps in the fabrication of a wafer. In an embodiment, a PSTS has exaggerated sensitivity to the performance or results of one set of fabrication steps, and much less sensitivity to results or performance of any other fabrication step. The sensitivity of a PSTS may extend to electrical affects resulting from the performance of one or more fabrication steps, including but not limited to a resistance or capacitance on a region of the wafer or die. The sensitivity of the PSTS may also extend to the physical attributes, such as gate width or length, impacted or resulted from a fabrication step. A PSTS may be structured so that the presence of a particular attribute in the die or wafer that stems from a fabrication step causes the PSTS to output or exhibit electrical activity that is associated with that step or attribute. As discussed in previous embodiments, the electrical activity can be measured as a performance parameter that can be analyzed to yield information about a fabrication step, sequence or process.

Prior art techniques provide for test structures that are placed in the scribe areas of wafers, are measured with testers that make mechanical contact, to produce process related parameters that correlate to variations in the scribe areas. Since the scribe areas are known to be a poor correlate to local variation inside the active die areas of the wafer—outside of the scribe areas, process variation measured in the scribe is a poor correlate to process variation in the active die areas of the wafer. There have been previous attempts to use test structures inside the die of a wafer. However, these approaches rely on measuring the test structures only after manufacturing of the wafer is completed. As such, the test structures can only measure process variations from a completely fabricated wafer.

In contrast to such past approaches, embodiments described herein provide for test structures that can be placed inside the active and critical part of the die during the fabrication process. The test structures may be stimulated in a non-contact manner to exhibit or produce electrical properties that can then be measured. The measurements of the electrical activity from the test structures may then be used to evaluate fabrication of the wafer while the fabrication is ongoing. As such, the structures provide a mechanism for using direct measurements to determine information about the effects of process variations inside the die. Embodiments described herein provide for process variations to be measured for partially processed wafers. This greatly accelerates the availability of specific process variation information, so that the information is available during the fabrication process, when corrective action can be taken.

In one embodiment, at least some of the PSTS that are placed on the wafer are sensitive to a specific fabrication step or sequence. The same PSTS may also be insensitive to other fabrication steps in the fabrication process. This negative association serves to isolate what fabrication steps the electrical activity of the PSTS is dependent on, so that the electrical activity of the PSTS provides a clear marker on one fabrication step or sequence.

Figure 4:
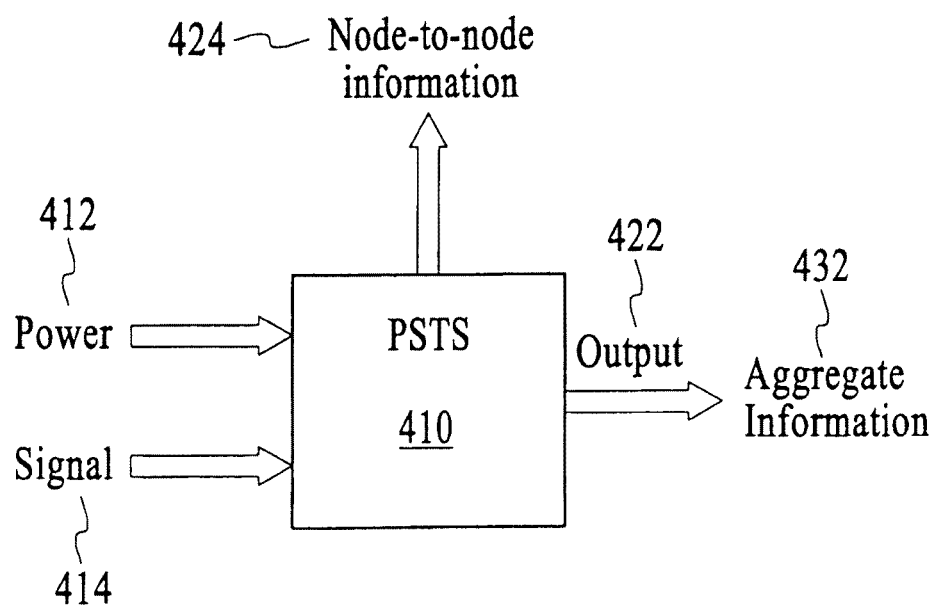
FIG. 4 is a block diagram of how a process-sensitive test structure may be used to evaluate a fabrication of a wafer, under an embodiment.

FIG. 4 is a basic block diagram illustrating a PSTS 410, according to an embodiment. The PSTS 410 may be configured so that a particular sensitivity to a desired fabrication step or sequence is made inherent in the structure. In an embodiment, a power 412 and a test signal 414 are inputs to PSTS 410. The power signal 412 stimulates the PSTS 410, while the test signal 414 triggers the PSTS. In an embodiment, when both power 412 and the tests signal 414 are supplied, PSTS 410 is activated to yield an output 422. In certain cases, it is also possible to activate the PSTS 410 by only stimulating or triggering the PSTS. In an embodiment, an incidental signal or series of node-to-node signals 424, internal to the PSTS 410, is detected when the PSTS 410 is activated. For example, the signal 424 may correspond to photons produced from transistors of the PSTS 410 as elements of the PSTS switch on or off, while signal 422 may correspond to an electrical signal aggregated from many nodes that reflects how the test signal 414 was modified by the PSTS. One or both the output 422 and the node-to-node signal 424 are used to determine one or more performance parameters. Examples of performance parameters include transistor switching speed, circuit timing, and slew rates of transistors and switches within the PSTS. Due to the structure of PSTS 410, the values of the performance parameters, as interpreted from output 422 and node-to-node signals 424, are directly dependent on particular fabrication-related attribute. For example, a circuit element may be used to determine how much incidental resistance (e.g. from contamination of a metal deposition) is formed on the wafer in high-density areas. Therefore, the circuit element's output is adversely affected by small amounts of unwanted resistance.

The output 422 and incidental signals 424 of PSTS 410 are used to obtain or formulate evaluation information 432 for evaluating the fabrication of the die or wafer. For example, if the output 422 is dependent on a physical property that is the result of a particular fabrication process, a correlation may be drawn between various values of the output within the chip and a specific process step. The correlation may require determining a variance of the output, or a comparison of discrete values of the output to desired or known values. The variance of the output may be used to determine a process variations and excursions.

As will be described in greater detail, various circuits and structures can be used for PSTS 410. A class of a particular PSTS structure may correspond to PSTS structures that have a common design. Other variables may be used to designate a class of PSTS structures. For example, a class of PSTS structures may correspond to all structures that are tied or otherwise indicative of a particular fabrication step, process or result. Numerous classes of PSTS structures may be distributed on a wafer, and inside the die of the wafer, particularly in the active regions of the die. Several PSTS structures of a particular class may be provided within the active regions of the die.

Figure 5:
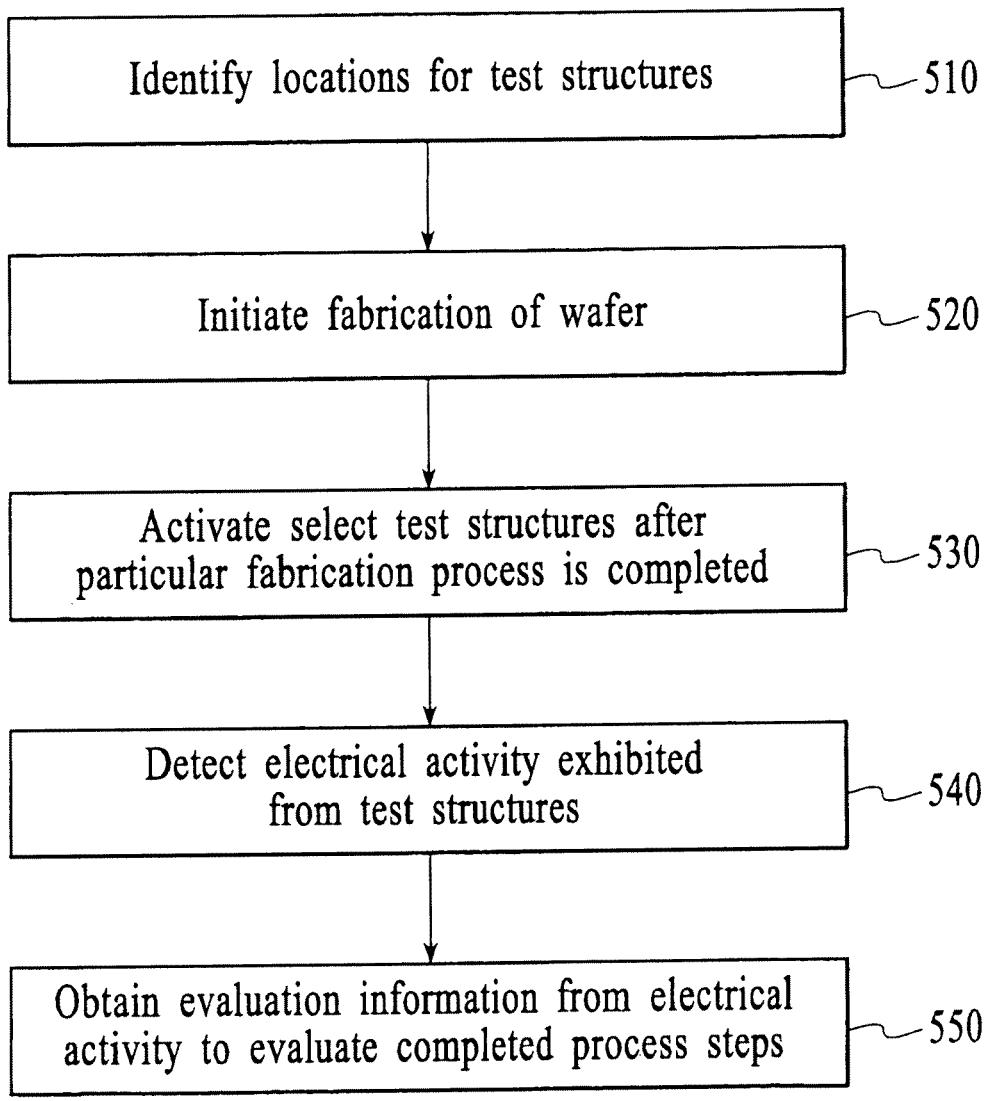
FIG. 5 illustrates a method for using process-sensitive test structures to determine evaluation information about a fabrication of a wafer, under an embodiment.

FIG. 5 illustrates a method for using test structures to obtain information about the fabrication of a chip or wafer. The information may be used to determine whether a particular fabrication step or sequence is being performed and providing results as expected.

Step 510 provides that locations for test structures are identified. These locations may correspond to locations on a wafer, on a die, and in discrete locations within the active regions of the die and could also be placed in the scribe for comparison the e-test structures typically placed there for in-line electrical contact testing. Depending on the test structure and the need, multiple test structures may, for example, be distributed on a single die.

Step 520 provides that the fabrication of the wafer is initiated. This may include the performance of processes, such as lithography or etching. Subsequent to deposition of the first layer of metal (often metal-one) electrical conductivity is established to allow for test structures to be stimulated and tested.

In step 530, select test structures may be activated at a particular fabrication. Thus, it is possible to distribute the test structures to be selectively activated at different fabrication steps. In this way, the test structures can be used to analyze certain processes prior to completion of fabrication, and prior to repetition of certain steps, sequences or processes. Thus, if, for example, the first metal deposition produces a flaw that impacts some die on the wafer, some test structures may be activated in order to determine that a problem exists with the first metal layer, but not the second.

In step 540, the electrical activity of the activated test structures are detected and interpreted. In one embodiment, the electrical activity corresponds to performance parameters such as switching characteristics of individual gates or structure as a whole (e.g. timing delays, slew rate, or circuit timing). Particular transistors and gates may be observed, or an output of the structure as a whole may be detected or measured.

Step 550 provides that information for evaluating one or more steps or processes in the fabrication of the wafer is obtained from the electrical activity of the test structures. The evaluation information may be in various forms. For example, the information may be statistical, and formulated over a duration that includes the fabrication of several wafers. Alternatively, the information may be for immediate use. For example, in the event output from a particular test structure is outside the acceptable range, the fabrication can be stopped, or adjusted for subsequent wafers. In any case, the evaluation information may be used at some point to make adjustments and modifications to a particular fabrication process, step or sequence.

According to embodiment described herein, test structures are formed from electrically active switching structures and other devices. The test structures may exhibit electrical activity under certain conditions, and measurements of the electrical activity may be correlated to information about the chip, die or wafer. In particular, the electrical activity may be measured and used based on a principal that a variance of the measurement of the aforementioned electrically active switching structures is related to the variance of discrete process components through the design of the switching elements. Electrical activity may be measured as an output 422 to the aggregate PSTS, or may be measured node-to-node for each element of the PSTS.

In one example, test structures may be developed that exaggerate the effects of gate length, but minimize the effects of other fabrication steps. In this example of gate length variance, where delay increases as gate Length increases, equation (2) simplifies to, $$\Delta P \approx \partial F/\partial L \cdot \Delta L \qquad (3)$$

and the variance that is measured from this switching circuit $\Delta P$ will be proportional to the process variance associated with gate length, $\Delta L$.

Figure 6:
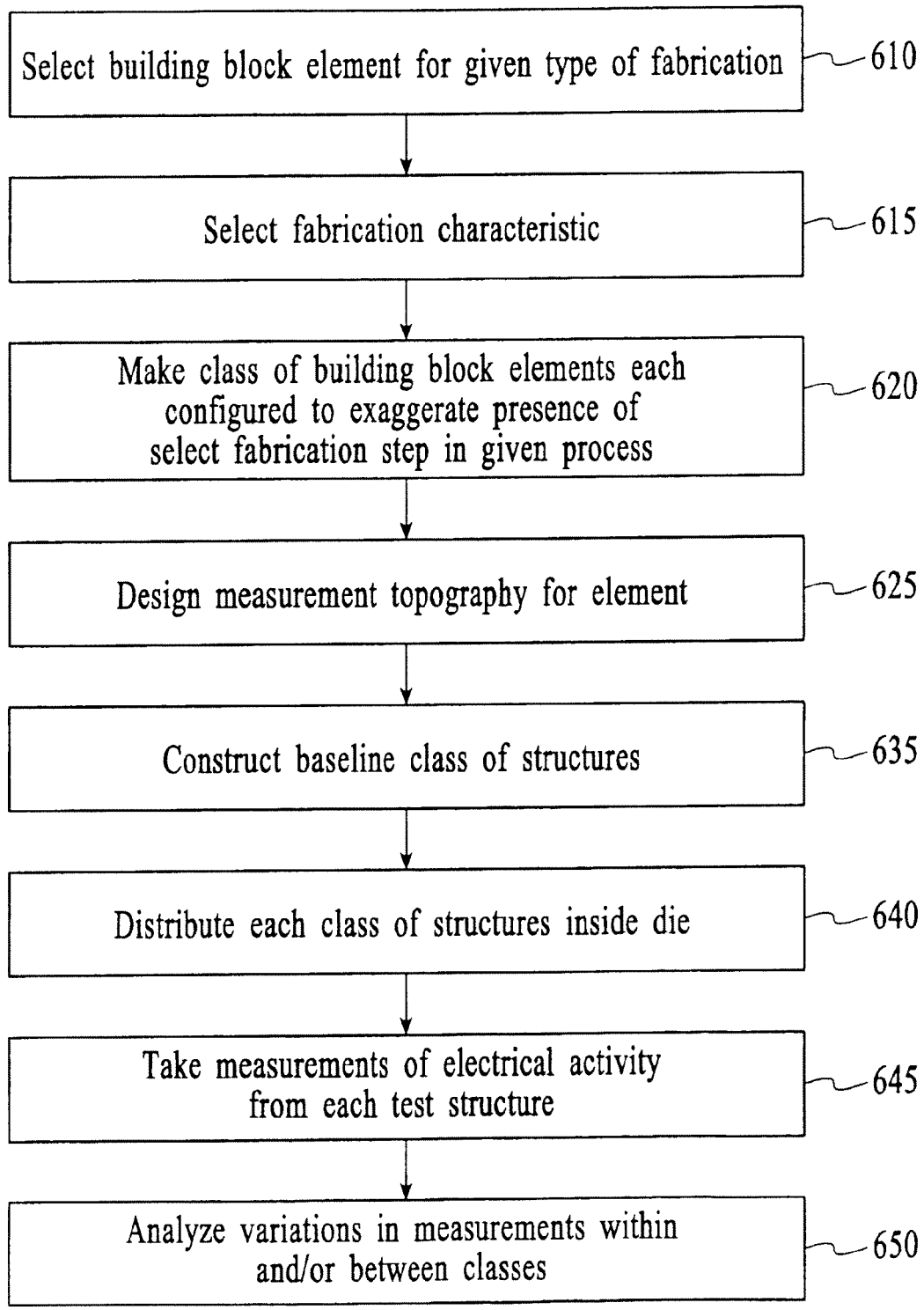
FIG. 6 illustrates another method for using process-sensitive test structures to determine evaluation information about a fabrication of a wafer, under an embodiment.
Figure 7A:
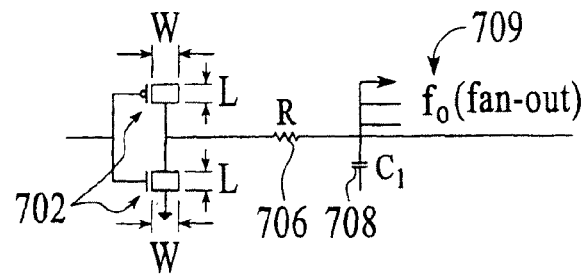
FIG. 7A is a diagram illustrating aspects of a suitable building block circuit element for CMOS technology, under an embodiment.

FIG. 6 illustrates a more detailed method for how PSTS can be developed and used, under an embodiment of the invention. For a given type of fabrication (such as MOS, CMOS, Bipolar, BiCMOS, etc. . . . ), step 610 provides that a simple building block circuit element is selected and/or designed. FIG. 7A is a diagram illustrating aspects of a suitable building block circuit element for CMOS technology indicating channel width (W) and length (L). A simple element can also be defined for other fabrication processes as will be known to those skilled in the art. The aspects may include: (i) one or more gates 702 (made from n-type and p-type transistors for CMOS, that can be manipulated in dimension (e.g. width or length), (ii) associated series resistance (R) 706 and capacitance (C) 708, (iii) adjustable load, or fan-out, of the building block 709, which can be seen as inputs from or to the next element in the measurement chain. One suitable type of building block circuit is a CMOS inverter chain, as illustrated with FIG. 7B, which illustrates use of CMOS inverters in a basic building block circuit.

Figure 7B:
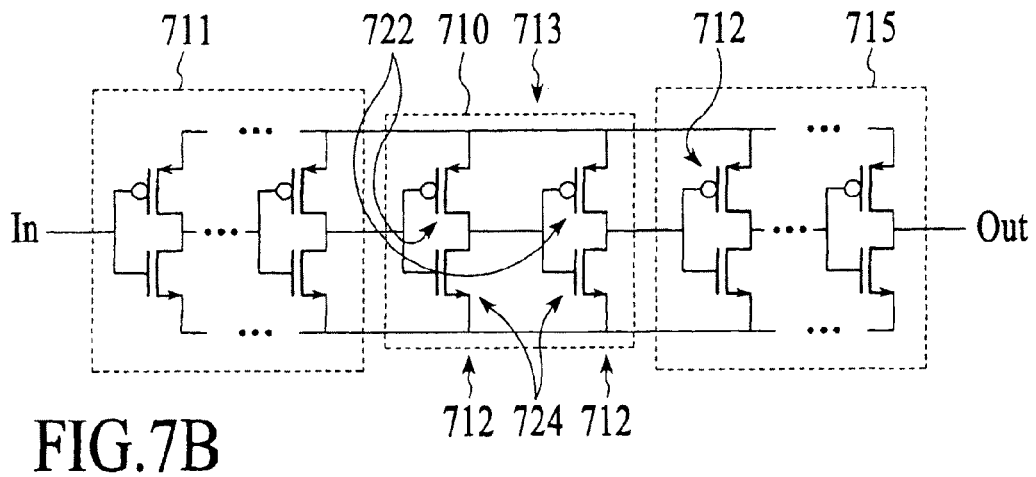
FIG. 7B illustrates a process-sensitive test structure composed of identical building blocks that can be formed on an active portion of a semiconductor component

FIG. 7B illustrates a PSTS composed of identical building blocks that can be formed on an active portion of a die with their associated power/stimuli and output pads and configured for purpose of making time-delay measurements that are sensitive to attributes and results of fabrication steps. The PSTS may include a circuit element 710 having a series of two or more serially connected inverters 712 which in an implementation shown by FIG. 7B, are CMOS switching elements. In an embodiment, each of the inverters 712 includes a pair of complimentary CMOS transistors. Specifically, each inverter 712 includes a p-channel type transistor (PMOS) 722 and an n-channel type transistor (NMOS) 724. In each inverter 712, the NMOS transistor 724 and PMOS transistor 722 have their respective gates connected together as input, and drains connected together as output. The source of the PMOS transistors 722 is connected to a positive supply voltage and the source of the NMOS 724 to the negative supply voltage. The substrate of the PMOS transistor 722 is biased positively (typically at the positive supply voltage), while substrate contact of the NMOS transistor 724 is negatively biased (typically at the negative supply voltage). Techniques are possible where circuitry may be operated with less supply voltage (see e.g. U.S. Pat. No. 5,936,477 teaching of Forward Biased Source-Tab Junction for low supply voltage).

A circuit element as shown in FIG. 7B is an example of a structure that can be manipulated to exhibit electrical activity that relates to an attribute of a fabrication step or sequence of the wafer on which it was formed. Furthermore, a serial inverter can be configured or incorporated into a larger structure to create process-sensitive structures. Such structures can provide an output that is indicative of a performance parameter. In an embodiment such as shown, the performance parameter may be a time delay between the input and the output of the structure, or some other indicating of a switching speed of transistors in that structure. If, for example, the transistors 722, 724 of some of the inverters 712 in that structure are physically altered to have their switching speeds affected by a fabrication step or sequence, then the structure can be placed at different locations and/or in different switching environments so that a difference in the time delay of two such structures is indicative of a process variation in the fabrication of the wafer.

In an embodiment, the PSTS may include three basic stages: an input buffer 711, a test stage 713 and an output buffer 715 The test stage 713 includes the circuit element that can be manipulated. The input buffer 711 and output buffer 715 controls the power input so as to control the rate at which the transistors of the test stage 713 turn on. Once power is delivered to the test structure, the transistors of the test stage 713 exhibit by design baseline and exaggerated characteristics related to a result of the fabrication step or sequence that they are measuring. In an embodiment, both the input and output buffers 711, 715 are common to all the test structures described below.

In step 615, an attribute of a fabrication step or sequence is selected. The attribute may be correlated to a particular performance parameter, where the performance parameter is measurable form electrical activity of the test structure.

Step 620 provides that a class of one or more test circuit blocks are formed, where test circuit blocks in at least some of the classes are designed to provide a performance parameter value that is exaggerated as to how it relates to the presence of the selected fabrication step or sequence. In particular, a variance in the measurements of the performance parameters of each test circuit blocks in a particular class is indicative of a variation in the corresponding fabrication-related attribute. In one embodiment, the variance in the measurements of the performance parameters of each test circuit block in the class is compared to a similar variance in the same measurements from a class of baseline structures (see step 635). Choosing the physical design of the individual blocks so that the maximum sensitivity of the switching circuit corresponds to the specific process parameter may be performed at this step. A device-circuit analysis program like the different versions of Spice or Spectre or even numerical simulation methods may be employed to accomplish this.

Figure 7C:
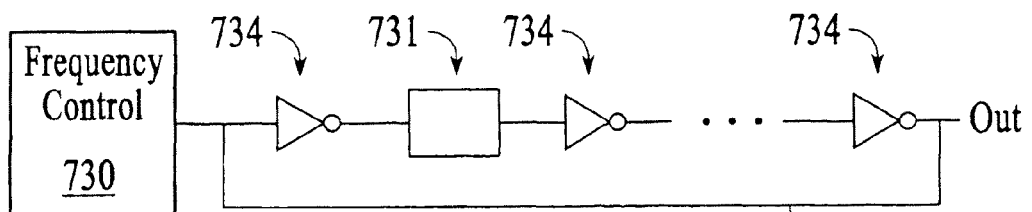
FIGS. 7C and 7D illustrate use of a delay sensitive element in a circuit comprising one or more inverters
Figure 7D:
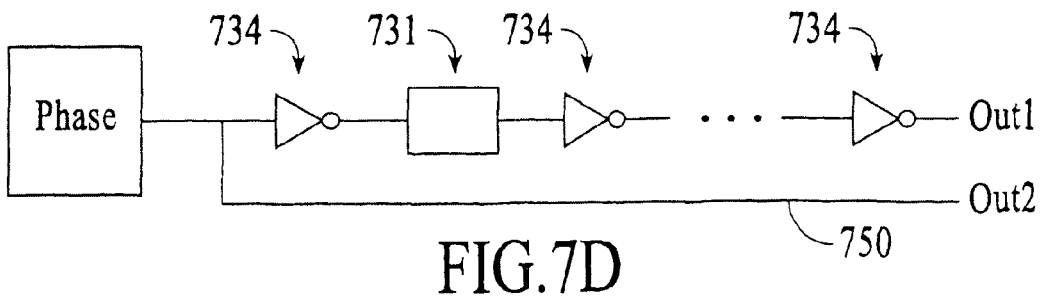

Step 625 provides that switching elements in the different classes of test blocks are placed within a measurement topography to make the switching elements amenable to test during wafer processing. Examples of how the measurement topography may be employed include delay-based measurements for both frequency and phase shift. In FIG. 7C, one or more delay-sensitive elements 731 is placed between or embedded in a series of inverters 734, and subject to control 730, or triggering, then interconnected back onto itself via a feedback 740 to create a Ring Oscillator (RO). In FIG. 7D the addition of a reference output 750 to indicate phase shift results in a phase based inverter circuit. The delay-sensitive element 731 may correspond to a structure that can be manipulated, as described with FIG. 7A. A completed test structure may comprise a test block placed in measurement topography. The types of fabrication-related attribute that can be evaluated through measurements of the respective performance parameters (such as delay-based measurements) include $L_{eff}$, interconnect resistance and capacitance, gate capacitance, leakage and other performance parameters. In one embodiment, separate PSTS' designed for different exaggerated sensitivities at the same location or the same PSTS with one specific sensitivity, or combinations of the two aforementioned scenarios could be dispersed through out the die or wafer and designed with distinct output "signatures" (e.g. frequency, or phase shift) per their location or sensitivity type or both, and thereby be detected concurrently and simultaneously but separately. In this embodiment a probe card including detectors and stimuli matched to the predetermined locations on the wafer could be utilized to probe die on the wafer simultaneously and concurrently and increase throughput.

A class of test structures for both individual fabrication attributes and a baseline may be constructed. The process of establishing a PSTS or groups of PSTS's for each process step or steps is repeated until all desired process steps are covered.

In step 635, a baseline class of structures is formed. In one embodiment, the baseline class is constructed from the same blocks as one or more of the classes of test structures. These baseline structures are designed to either be insensitive to the exaggerated process step sensitivity of the PSTS's, or are designed such that when co-located with the PSTS's with exaggerated sensitivity the difference of the two structures' result has an exaggerated sensitivity to the process step. While the baseline class of structures is not necessary, the use of such test structures may have benefit.

Step 640 provides that each class of PSTS, including the baseline PSTS, are distributed inside a die. In step 645, measurement of electrical activity is taken from each test structure. As shown with FIGS. 7C and 7D, examples of electrical activity include device performance measurements (e.g. frequency and phase delays) that indicate the response of process sensitive structure. The electrical activity may include how each PSTS handles and outputs a test signal, as well as how individual elements of the PSTS perform (e.g. timing and slew-rates and shape of individual gates switches). Types of electrical activity may, as mentioned elsewhere in this application, include electrical activity output signals and photonic signals. Optoelectronic signals can be detected and resolved from photonic signals generated by the test structures. Additionally, structures can be designed such the electrical activity produces electromagnetic and or optoelectronic signals to a detection pad 1130. Additionally, structures can be designed that allow for electron-beam and ion-beam techniques to detect electrical activity present at the detection pad 1130.

In step 650, variations in measurements taken in step 645 are analyzed. The analysis may be among a PSTS in a particular class, or between classes (individually or in group) of PSTS, or as compared to one another, or "simple" speed measurements of non-PSTS devices, or non-sensitive structures. In particular, each class of PSTS may be compared to the baseline class of PSTS in order to determine whether variations in that particular class or beyond a designated variation in relation to a baseline variation measurement.

Figure 8:
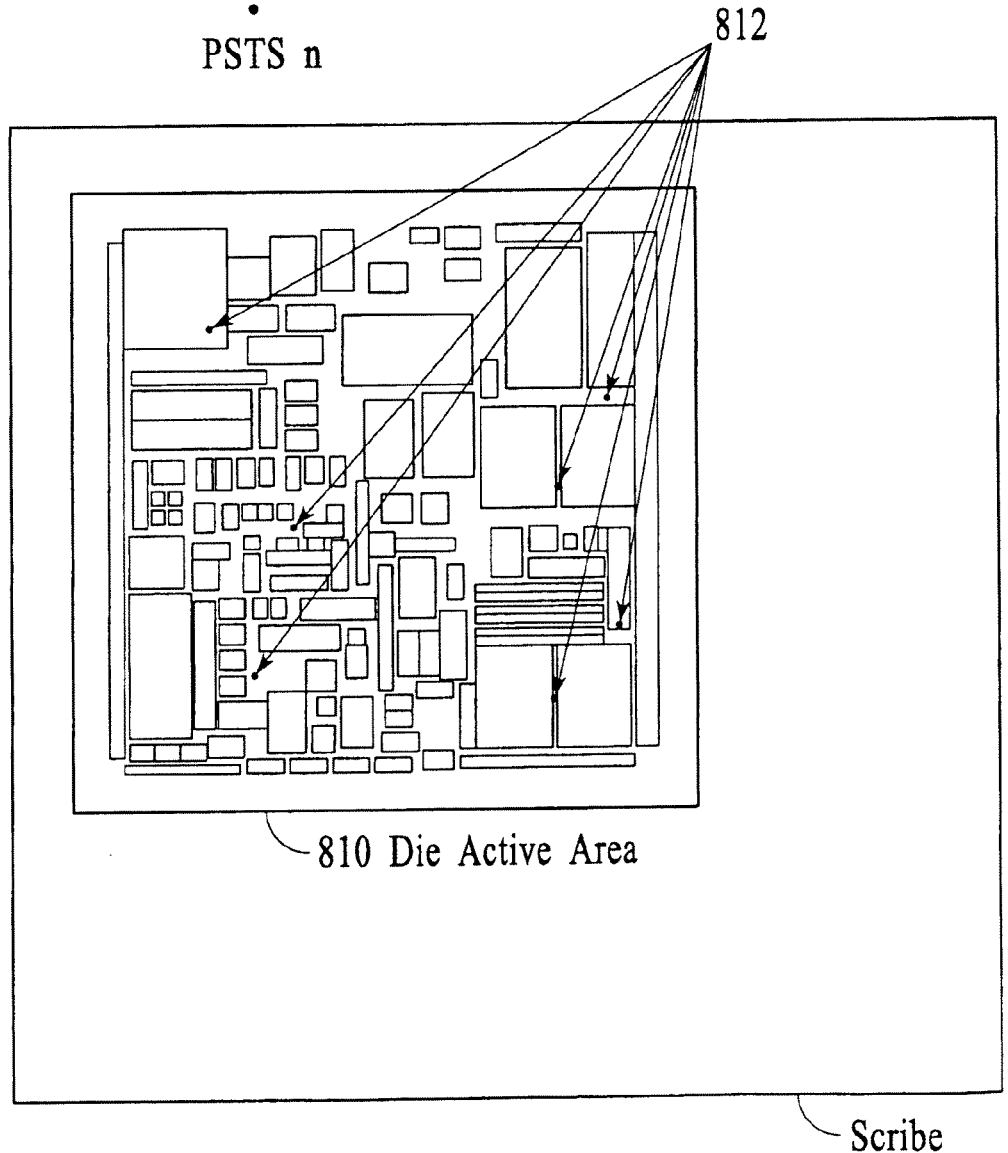
FIG. 8 is a representative example of how a method such as described with FIG. 6 may be performed.

FIG. 8 is a representative example of how a method such as described with FIG. 6 may be performed. FIG. 8 illustrates a collection of PSTS distributed at various locations 812 of a die active area 810 (surrounded by scribe), including the nominal or baseline PSTS (an output of which is represented by numeral 802), which are physically co-located with and in the immediate vicinity of one another and the power, signal and detection circuitry and pads. It is assumed that the baseline PSTS includes switching elements that are similar to the switching elements of the design building blocks for one or more of the class of PSTS. With reference to FIG. 8, the collection of PSTS may include different classes of PSTS, where each PSTS class is sensitive to one or a group of process parameters. The total set of structures will experience identical process variation due to the proximity of their placement at each location that will be dominated by local pattern density variations and/or other local processing conditions. During processing, measurement of the control structure will establish the impact of local process variation on that structure, and can be used as a normalized and calibrated datapoint against which the other process and/or location sensitive measurements and their respective measured variances will be compared to and calculated as an indicator of. In turn, the variation will manifest itself in the corresponding PSTS adjacent with the control structure. Local process variation results in changes to the physical dimensions of switching circuit devices, or to the devices doping, or both. In turn, these variations impact the measured performance-related parameter (e.g. frequency or phase response) of the PSTS. In one embodiment, electrical measurement comparison of the baseline structure to the other structures will contribute to isolation of one fabrication characteristic that is most related to the process variation, since only the switching circuit sensitive to the process variation will show significant variation in its performance parameter. This can allow a set of measurements to distinguish, say, between the gate-module issues ($L_{eff}$) and interconnect dishing resulting in variations from the baseline "norm" in interconnect resistance. Previous techniques sought to place different test structures in physical proximity to portions of chip designs to simulate local process loading. In contrast here, test structures, adjoining structures for power generation and conditioning, and signal detection are placed adjacent to one another and are co-located inside the chip active area and in the vicinity of areas of pattern density fluctuation.

FIG. 9A illustrates a test stage circuit element 920 that can be formed on the active portion of a die with their associated buffers, power/stimuli and output pads and circuitry, and configured for the purpose of producing time-delay or phase shift measurements with respect to the baseline circuit or with respect to each other to exaggerate the influence of p-doped or n-doped gate length ($L_p$, $L_n$, respectively) 910, 912 on the overall response of the circuit 920. This can be accomplished by modifying the switching element, series resistance (R), and series capacitance (C) according to the principles illustrated by FIG. 7A, and furthermore, by purposely designing $L_p$ and $L_n$ at the minimum allowable, near-minimum or sub-minimum gate length while keeping the p-doped and n-doped gate Widths ($W_p$, $W_n$ respectively) at larger values. For the same amount of dimensional variance arising from local pattern density induced variations, $\Delta L=\Delta W$, therefore, the variance will be a larger portion of the overall gate lengths than that for the gate widths, or $\Delta L/L > \Delta W/W$. In turn, the measured variance in the frequency or phase of these devices will be highly sensitive to gate length. Identical interconnected elements 920 are nested within either electrically active or passive elements 924 to replicate (mimic) local circuit design pattern density. As those skilled in the art will recognize, individual n-device or p-device sensitivity to channel length can be achieved by either an $L_p$ or $L_n$ that is designed to exaggerate the influence of $L_{eff}$ on circuit speed performance.

FIG. 9B illustrates a test stage circuit element 930 that can be formed on the active portion of a die with their associated buffers, power/stimuli and output pads and circuitry, and configured for the purpose of making time-delay or phase shift measurements to exaggerate the influence of interconnect resistance on the overall response of the circuit. This can be accomplished by purposely modifying a length of interconnect 934 such that dimensional variance arising from local pattern density induced variations or thickness variations will impact the measured variance in the frequency or phase of these devices. The interconnect is modified such that it's width is kept at minimum dimensions and its length is chosen to create a series resistance large enough to distinguish time delay of the aggregate structure 930 from those of adjacent inverters in FIG. 9B, and such that local variations in thickness and width will have a greater impact on the delay of element 930 than the adjacent elements in FIG. 9B. The comb tine features 936 adjacent to, but not electrically connected with interconnect 934 will ensure that the PSTS does not change and impact the pattern density in its vicinity. The aforementioned device can be placed at one or multiple interconnect levels to isolate the impact to interconnect resistance from different interconnect levels.

FIG. 9C illustrates a circuit element 940 that can be formed with its associated buffers, power and detection elements and circuitry, on the active portion of a die and configured for the purpose of making time-delay or phase shift to exaggerate the influence of interconnect capacitance on the overall performance response of the circuit. This can be accomplished by purposely modifying a length of interconnect 944 such that the RC contribution to the delay of the aggregate circuit element 940 is distinguishable from adjacent elements in FIG. 9C, and such that line to line dimensional variance arising from local pattern density induced variations or film thickness variations will have greater impact to the measured variance in the frequency or phase output of element 940 than other elements in FIG. 9C. Additional features 946 adjacent to, but not electrically connected with interconnect 946 will ensure that the PSTS does not change the pattern density in its vicinity. The aforementioned device can be placed at one or multiple interconnect levels to isolate the impact of separate levels of interconnect capacitance from different interconnect levels.

The complement of measurements from the devices illustrated in FIGS. 9A, 9B, and 9C will describe the overall and individual physical variance signatures providing vital information for the control of interconnect processing for the adjacent devices critical for the timing distribution within a chip, for clock skew, and any additional performance impact of the interconnect structures.

FIG. 9D illustrates circuit elements 950, 960 and 970 that can be formed on the active portion of a die with their associated buffers, power/stimuli and output pads and circuitry, and configured for the purpose of inducing time-delay or phase shift measurements to exaggerate the influence of gate capacitance on the overall timing response of the circuit. This can be accomplished by purposely modifying the areas (L×W) 952, 954 and 956 of the gates of groups of devices in known area increments. Each increment will impact the measured variance in the frequency or phase of these devices with different area to perimeter values owing to either gate film stack variance (area) vs. gate perimeter area (source-drain implant and photo/etch). Additional devices similar to circuit element 920 that are adjacent to, but not electrically connected with the device in FIG. 9D, as taught in FIGS. 9A, 9B, and 9C, will ensure that the PSTS pattern density is similar to the device density for active devices in its vicinity.

FIG. 9E illustrates a circuit element 980 and 990 that can be formed on the active portion of a die with their associated buffers, power/stimuli and output pads and circuitry, and configured for the purpose of making time-delay or phase shift measurements to exaggerate the influence of gate capacitance on the overall response of the circuit, also. The number of devices in 982 and 984 are chosen such that the devices have equivalent performance to circuit elements 960 and 970, respectively. Comparison of the frequency or phase delay results between the devices in FIGS. 9D and 9E will separate the perimeter effect of etch (FIG. 9E) vs. source-drain extension (FIG. 9D) capacitance. Additional devices similar to circuit element 920 and adjacent to, but not electrically connected with the device in FIG. 9B, as taught in FIGS. 9A, 9B, and 9C, will ensure that the PSTS pattern density is similar to the device density for active devices in its vicinity. Sources of variance for these devices may also include the presence of impurities in the gate dielectric material, gate electrode doping segregation, etc.

FIG. 10 illustrates a PSTS that can be formed on the active portion of a die with their associated buffers, power/stimuli and output pads and circuitry, and configured for the purpose of making time-delay or phase shift measurements to exaggerate and correlate the offset between critical dimension scanning electron microscope (CD-SEM measurements) and electrical critical dimension (CD) measurements. CD-SEM measurements are typically correlated to electrically active devices in the scribe line in order to ensure that a "good" process window for CD's—that is CD's meeting the electrical process specification—is determined during process development. Since CD-SEMs are not sensitive to the electrical impact of source drain extension implants, or to channel doping properties, such a correlation is performed routinely to make certain that the electrical CD equivalent of the measured physical CD is within specification. A structure such as shown may measure signal delay between switching circuit elements, and a CD SEM can measure CD variations for the isolated and dense structures in the vicinity of the timing structures. Data from both are used to determine lithography and etch process windows. In FIG. 10, an isolated area 1010 and a densely packed area 1050 of devices are created. A repeating circuit element 1030 is designed such that the gate length 1042 of the element 1040 is identical in geometry to an isolated line 1020. Similarly, dense line 1060 and the gate length 1082 of devices 1080 in a densely packed area are identically designed. Electrical measurement of isolated areas 1010 and dense areas 1050, and CD-SEM measurement of isolated line 1020 and gate length 1042, as well as dense line 1060 and gate length 1082, serve to establish a physical gate length (L) to electrical gate length ($L_{eff}$) correlation. When the measured frequency variation or phase variation is compared to the CD SEM result an offset can be directly established.

According to another embodiment, an inverter chain (see e.g., FIG. 7B) is provided as part of a test structure in order to measure the speed with which the n-channel and p-channel devices switch, and the total delay associated of the entire chain when the chain is powered and stimulated at clock speeds of the native design of the product process. Placement and measurement of these structures and their associated power/stimuli and data collection circuits and pads within the active area chip area (see FIG. 8) would therefore allow the assessment of in-chip variation from these structures. The placement of these structures in the active areas of the chip may also provide for a simple yield screen at the first level of metallization to segregate the wafers which fall outside of the desired performance specification (e.g. slower) than desired wafers from continuing the manufacturing process.

In another embodiment, the simple inverter chain (similar to FIG. 7B) of the test structure can be designed such that several elements in the chain have a designed-in flaw that is sensitive to process fluctuation. For example, an additional serif can be added to the gate strap area such that it is more likely to "scum", impairing proper etching of the feature and resulting in a hairline short between the gate strap and an adjacent metal strap. Placement and measurement of these structures within the active area of the die (chip) and staging fixed lithographic defocus steps through and past known optimal focus, would therefore allow the assessment of in-chip variation that is prone to shorting and would allow for readjustment and the rectification of the lithography optimal focus setting and offset process etching variables commensurate with the sensitivity to "scum" due to local pattern variation.

Still further, another embodiment provides that the simple inverter chain of the test structure is structured so that the circuit speed can be segregated between device process missteps versus interconnect processing. These circuits would be designed to add a fixed amount of interconnect capacitance representative of typical distribution lengths. Measurement at metal-one deposition can provide in-chip variation measurements of circuit speed. Since the inventive techniques disclosed here are non-contact, noninvasive and require only line-of-sight to actualize the measurement, subsequent measurements of the same structure at metal-two or metal-three depositions, or at any metal level up to and including metal-final, will allow the segregation of in-chip variations caused by interconnect RC delay arising after metal one, from any of a number of process and/or design issues at Metal 2, Metal 2, etc..... Among other advantages, such a design focuses yield engineering resources on the metal interconnect sequence that is not within expected measurement tolerances. Once the metal interconnect process is rectified, similar measurements can validate the efficacy of the process "fix".

In another example, circuit subsets from advanced customer designs can be added to an existing mature chip. Placement and measurement of these structures within the active area of the chip area would therefore allow the assessment of in-chip variation of these new circuits in the presence of local pattern variation. Placement of such structures may also provide for a quick yield screen at the first level of metallization to segregate slower and faster than desired circuits, resulting in quick feedback for the designers to further optimize their circuits prior to committing the design to large manufacturing volume.

Embodiments of the invention contemplate various other circuit designs for use as test structures. Among other advantages, embodiments described herein can readily accommodate known n-channel and p-channel devices made today, as well as more complex devices being considered in future manufacturing processes.

The aforesaid specialized test structures may be designed using various computer-based circuit and physical design and analysis tools well known to persons of skill in the art. One example of such a design tool is "PROPHET" developed by Center for Integrated Systems, Stanford University, California. Because PROPHET and similar design tools are capable of predicting circuit characteristics for different values of process parameters, the design of the structure may be optimized to provide sensitivity to only select process parameters and not the others.

The placement of test structures and their associated power/stimuli and detection circuitry and pads on a wafer or chip according to FIG. 8 may be one of a design choice. According to one embodiment, such structures are placed along principle diagonal inside the product chip. Alternatively, the structures may be placed along a domino pattern, including, for example, top left, top right, center, bottom left and bottom right areas of the chip. Alternatively, for example in microprocessors (MPU), central processors (CPU) units and ASIC devices, the structures may be placed near the perimeter and internal to core logic, or SRAM blocks, etc. It should be noted that the exact location of the test structures on the chip is not essential to the present invention. Other suitable location choices are possible, including unused portions of the wafer, dedicated test chips, scribe, and on test wafers.

Intra-Chip Power and Signal Generation for Test Structures

There are numerous ways to use test structures for purpose of evaluating fabrication. In order to utilize test structures prior to completion of fabrication, it is advantageous to overcome certain challenges. Among these challenges, the test structures may need to be activated prior to the integrated circuits on the remainder of the chip being fully formed. Furthermore, it is desirable to test as many chips on a wafer as possible, while not destroying or damaging those chips.

Embodiments described herein provide test structures within on a wafer. The test structures are provided power and test signals from co-located structures in the die active area or the scribe in order to evaluate fabrication of the wafer. For one of the objectives of the invention, in-die stimulation of signals to the test structures, the required power and test/trigger signals are provided to the chip in a non-destructive, non-contact and non-invasive manner. Furthermore, the test structures can be activated at any point after the deposition of conductive material (e.g. after local interconnect or metal-one) on the wafer. Accordingly, one embodiment provides that the test structures are scattered throughout numerous (if not all) chips that are on the wafer (including scribe and unused areas of the wafer or test chips) and that the test structures can be triggered, stimulated or otherwise activated at the different stages of the fabrication (in-line). Each test structure may be used repeatedly, without affecting subsequent usability of the chip, and without disrupting the process flow of the fabrication. Valuable information regarding how the fabrication can be controlled and/or improved may be determined from using and testing the test structures in this manner, especially in the active area of the chip/die. This information may be region specific on the wafer (e.g. corners of the wafer), die or chip specific, or wafer-level, as it may apply to a plurality of the chips that are formed on the same wafer, and may further be compared from wafer to wafer and lot to lot. Furthermore, as previously described with other embodiments, the test structures may be specialized to provide information about a process variation and/or one or more fabrication steps of the wafer.

FIG. 11 is a representative block diagram illustrating a scheme to populate regions of a partially fabricated wafer die, including intra-die regions, with test structures that can then be used to measure performance parameters correlated with process steps or process step sequences of the fabrication, or for performance related (e.g. speed) monitoring of the same area within the die(s) or the wafer (s). The test structures may be used within one or more fabrication steps to evaluate the fabrication of the wafer. In an embodiment such as illustrated in FIG. 11, test structures 1120, power receiver 1112, test/trigger receiver 1110 and detection pads 1130 can be co-located in a chip 1102, and may be tested repeatedly and non-destructively. Furthermore, the chip 1102 may be tested in either a completely or partially completed fabrication state. For example, according to an embodiment such as described with FIG. 11, test structures may be activated and tested early on in the fabrication of the wafer in order to evaluate one or more initial fabrication processes, then activated later on in fabrication to evaluate subsequent fabrication processes. The test structures may also be stimulated/activated and tested to evaluate an overall fabrication and/or performance of the chip once fabrication has been completed.

According to an embodiment, chip 1102 is provided a test/trigger receiver 1110, a power receiver 1112, one or more test structures 1120 (possibly of different classes or designs) and corresponding detection pads 1130. All of these components may be formed on the active area of the die in more than one location for intra-die measurements. The power receiver 1112 may be stimulated or energized to generate a power signal for the test structures 1120. In an embodiment, the power receiver can be made of one or more photodiodes. The combination of the power signal and the test/trigger signal activates the individual test structure. The test/trigger receiver 1110 may be stimulated or energized to generate a trigger signal for the test structures 1120. In an embodiment, the test/trigger receiver can be made of one or more photodiodes with fast, transient response. Both the test/trigger receiver 1110 and the power receiver 1112 may be stimulated or energized by an outside energy source. In particular, the test/trigger signal and power signal may activate the test structure 1120 into exhibiting a detectable electrical activity. The electrical activity may include, but not limited to, the emission of hot-electron induced photons (which could be detected for timed-resolved photon emissions which are time-correlated to switching events in active junctions), output of one or more electrical signals, time-correlated change in one or more types of electro-optical properties (e.g. charge-induced electro-rectification and/or electro-absorption), and/or other electrical activity at the junction of the interconnect.

In order to not mechanically or electrically destroy, damage, perturb or otherwise affect the usability of the chip 1102 and prevent or disrupt further steps in the fabrication process flow, an embodiment provides that the active area co-located test/trigger receiver 1110 and the power receiver 1112 are energized through a contact-less and non-invasive energy medium. Other embodiments may provide test structures intra-die that are activated by only a power signal. In either case, the activation of the test structures is accomplished by co-locating (in the same active area on the same die) intra-chip energy sources (power/test) with the test structures. In an embodiment shown by FIG. 11, separate energy and trigger/test sources (e.g. beams) from outside of the wafer may be used to energize test/trigger receiver 1110 and power receiver 1112. In one embodiment, a first energy source 1108 may direct a constant energy beam onto power receiver 1112, so that the resulting power signal for the test structure 1120 is constant. A second energy source 1106 may direct a time-(and/or amplitude) modulated beam onto test/trigger receiver 1110. The modulated beam results in a modulated test signal to be inputted for the test structure 1120. This subsequent electrical activity of the test structure 1120 may be based on the modulated input from the test/trigger source 1106. The test/trigger receiver 1110 may be energized simultaneously or concurrently with the power receiver 1112. According to one embodiment, first energy source 1106 is a laser beam produces a constant source of energy for power, while second energy source is a laser that produced a pulsating (e.g. time-gated) modulating beam.

Alternatively, the same energy source 1108 may be split with one portion going to the power receiver 1112 and the other portion can be modulated and sent to test/trigger receiver 1110.

The electrical activity that results from the test structure 1120 being triggered may be measured as a performance parameter, such as switching speed, phase or signal delay, or slew rate. In one embodiment, switching speed may be measured node-to-node (individual gate-level), such as for an individual transistor, as well as end-to-end on the test structure 1120. The test structure 1120 may be specialized so that the performance parameters can correlate into information about specific fabrication step(s) or sequence(s), and more specifically, process variations across the chip or die, wafer, or from one wafer to another wafer. The evaluation information may include direct performance measurement of device speeds useful to forecast final fabrication quality, and/or information that isolates process variations caused by certain fabrication steps, including information about the results of specific processes and how those processes were performed.

In one embodiment, some of the electrical activity of the triggered test structure 1120 may be a nodal signal output in the form of an optoelectronic effect. For example, hot electron emission intrinsic to the device switching is a probe-less measurement technique that can be deployed through the use of well-designed photon detector 1142. In another example, other optoelectronic effects such as charge induced electro-absorption and electro-rectification may require the use of a probe/detector 1142. In another example, an electron beam probe/detector 1142 can be configured to detect node-to-node switching events.

The test/trigger signal may also be used to provide a repetitive "timing edge" for the purposes of time-based measurements which can yield node-to-node information, and also as a test vector that could be used to measure response of the test structure node by node. The signal output at each node (and ultimately at the output node/detection pad) may be analyzed to ascertain how the test structure 1120's internal gates, transistors, or other nodes affected the test signal. The node-to-node output signals may reflect information from when an individual transistor switches and changes its state, and also the impact of the active circuit on how the test signal changes and evolves in time and shape from node to node. Therefore, the nodal signal output from transistors and other components of the test structure provide information on how the test signal is processed at a particular transistor, gate or other node in the test structure. Since electrical activity from individual transistors is observed, the information on how the test signal is processed is said to be "node-to-node". In this embodiment the test signal could also be used to supply the timing "edge" required for time-based measurements. Also, for those familiar with the art, the test vector could be used for complex diagnostic/design purposes and analysis on the wafer or die in the fabrication process. This is task that is usually performed on packaged (post passivated and fully processed die).

As an alternative to node-to-node detection of electrical activity, an embodiment using a test/trigger vector on the test structures can detect electrical activity from a test structure in aggregate, meaning the electrical activity reflects how the power or test signal evolved between input and output ends of the test structure (and not at individual gates and nodes of the test structure). This electrical activity may be an aggregate signal output. In order to detect the aggregate signal output from the test structure 1120 in a non-contact and non-destructive manner, detector pad 1130 may be used. The detector pad 1130 may convert an electrical output signal from test structure 1120 into some other electrical activity that can be detected by contact-less means and medium. As mentioned, the electrical output signal reflects how the test signal was processed between input and output stages of the test structure.

In an embodiment, the aggregate time-delay of the test structure/circuit can be manifest in frequency and detector pad 1130 is electromagnetically (e.g. capacitively or inductively) coupled to a signal based on the electrical signal of the test structure 1120. A receiver 1140 may be positioned over the detector pad 1130 to detect and measure the signal from the pad. For node-to-node detection of test structure 1120, an appropriate probe/detector 1142 combination may be used to probe/detect the signal from individual gates of the test structure. For example, a laser probe and optical detector for electro-rectification or electro-absorption effects; or electron-beam probe with appropriate time-gated detector; or a time-resolved detector for probe-less measurements of hot-electron induced photons.

The information that can be identified from the output signals provides a certain type and/or range for a performance parameter value. Furthermore, the test structure 1120 may be designed so that its activity, whether in the time-based node-to-node form, or aggregate (input/output) delay signal, is sensitive to a particular fabrication step in the fabrication of the wafer. As described elsewhere in this application, the performance parameter values may be analyzed in various ways to evaluate fabrication of the wafer. For example, a variance of the performance parameter values may be determined using a common test structure that is disposed at multiple locations of one die, or across many die and other locations of the wafer. Because the performance parameter values may depend on test structure design, one embodiment provides that the performance parameter values identify information about specific fabrication steps or sequences, including process variations.

An embodiment such as described in FIG. 11 may eliminate the use of trace lines and other mechanical probe devices that reside in the scribe to the chip 1102 for purpose of providing the test and/or power signals and stimuli. The elimination of such mechanical contacts enables the key and necessary requirement that individual chips formed from the wafer to be hermetically sealed when fabrication is completed. According to current chip design, the seal is required for the chip to be insensitive to moisture and other contaminations from the environment, a requirement for most (if not all) semiconductor components. Consequently, a scheme such as shown in FIG. 11 may identify or determine performance values of various types and at numerous locations on the chip 1102 or its wafer, without affecting the usability of the chip 1102. In addition, the scheme allows for the test structure 1120 to be activated and triggered at every chosen step of the fabrication process. Numerous test structures of multiple classes may be used. As such, tests may be performed repeatedly on the chip 1102 at different stages of the fabrication process.

FIG. 12 illustrates a method for using a test structure when the power and test/trigger signal for that test structure are generated intra-die, according to an embodiment. Reference is made to elements of FIG. 11 in order to illustrate suitable components or context for implementing a method as described.

In step 1210, a power signal is induced within the die active area and applied to the test structures 1120 a particular juncture during fabrication, or after its completion.

In step 1220, a test/trigger signal is generated within the chip (in the active area) and applied to one or more test structures 1120. The test/trigger signal may be generated by an external, non-contact energy source (e.g. first energy source 1106) that energizes a designated region on the chip, and causes that region to generate a test/trigger signal (or equivalent thereof). According to an embodiment, the application of the power and the test/trigger signal to the one or more test structures is what activates the test structures into exhibiting electrical activity. Step 1210 may be performed concurrently or simultaneously with step 1210. In particular, the application of the power and the test/trigger signal may be simultaneous or concurrent. The power signal may be generated in the same manner as the test/trigger signal-in that an external, non-contact energy source may energize a designated region on the chip. With reference to FIG. 11, the designated region of chip that is energized corresponds to power receiver 1112. In one embodiment, a single region on the chip 1102 may be used one or more times to distribute power to multiple test structures on that chip, during one or more testing phases.

In step 1230, electrical activity resulting from individual test structures 1120 being activated is detected. The electrical activity of the test structures (which may themselves be sensitive to fabrication steps) may be in the form of node-to-node output, aggregate signals, and combinations thereof. Detection of either type of electrical activity may require use of specifically designed probes (if needed) and associated detectors, as described elsewhere in this application. In an embodiment for an aggregate (input to output) signal, the addition of detection pad 1130 transmits a signal corresponding to the aggregate output signal of one or more test structures (including the individual nodes of the test structures). As discussed elsewhere, the aggregate output signal may be provided a signature to identify the test structures that contribute to the aggregate signals.

Step 1240 provides that the detected electrical activity are interpreted as a performance parameter variance relating to a quality metric related to yield, or relating a process step or steps in the process sequence. Examples of performance parameters may correspond to any one of the following: (i) a switching speed of the test structure as a whole, or within individual gates; (ii) a frequency or phase delay as to how the output signal differs from the input signal to the test structure 1120; and (iii) a measurement of a slew rate and shape (in time) for one or more transistors, or the aggregate signal for the test structure as a whole.

According to an embodiment, step 1250 provides that the variance of the performance parameters, or the variance to a baseline, are analyzed in order to correlate them to one or more specific steps, sequence of steps, or processes in the fabrication of the wafer. In one embodiment, a variance of the performance parameter values is determined to identify process variations. Other examples of analysis functions include performing comparisons between performance parameters as measured by separate test structures at different locations of the die, or having different designs. The analysis may also include correlating the values of the performance parameters (or variances thereof) to particular fabrication characteristics that are associated with specific processes performed in the fabrication prior to the test structures being activated.

A method such as described may be performed without affecting or damaging the chip. Both the application of the power and test/trigger signal, as well as the detection of the signals from the test structure, may be done without affecting the need to seal (or passivate) the die/wafer and it enables reuse all of its components when fabrication of the wafer is complete.

Power Generation and Regulation

A test structure such as described with FIG. 11 may have sensitivity to variations of the input signal. In particular, any fluctuation in the input power provided to a test structure may amplify or skew an output of the test structure so as to obscure output variations that are attributable to process variations or fabrication characteristics. Furthermore, since the energy source used to generate the power signal at the receiver co-located with the test structure is external to and off-chip, the conversion of energy into a power signal may carry inherent instabilities and fluctuations. The result is that an in-chip power signal generated from an off-chip power source may require appropriate buffering, regulation (e.g. rectification) and/or stabilization.

FIG. 13A illustrates a circuit for regulating an input voltage created by an external power source that can be co-located in the die active area with power receivers, test/trigger receivers, test structures and detection pads. A circuit 1305 includes a photodiode 1304, a regulator 1310, an on-chip reference voltage mechanism 1316 for providing a reference voltage, and a PSTS 1318 (such as described with FIG. 4). In an embodiment such as shown, the external power source is a continuous wave (CW) laser 1302 which directs light onto the photodiode 1304 and the reference voltage circuitry 1316, such as a band-gap voltage reference. In an alternate embodiment, the photodiode 1304 operates in a mode to regulate and fix the voltage to the PSTS 1318 in a narrow range. The photodiode 1304 creates a voltage that is regulated and stabilized by regulator 1310. In an embodiment where the external power source is the CW laser source 1302, regulator 1310 regulates the voltage for a PSTS 1318 to be within a narrow band or range. In the case where the external power source is alternating (e.g. pulse-amplitude, time, gated modulated), regulator 1310 may also rectify the input voltage. The regulator 1310 may include a comparator 1312 that compares a voltage level of the input to the PSTS 1318 to a reference voltage provided by band-gap voltage reference 1316. An output of comparator 1316 may feed regulator 1310 to make adjustments to the voltage of the input to the PSTS 1318. In one embodiment, the regulator 1310 includes a voltage multiplier circuitry, such as a switched capacitor voltage doubler, for regulation including a voltage multiplier for test structures requiring more voltage than created by the power receivers.

The sensitivity of the PSTS 1318 may require the input voltage to be stable, or in a narrow band of variation. In the case where the voltage provided from the photodiode 1304 exceeds the upper level of the band, regulator 1310 may reduce the voltage on the input line to the PSTS 1318. In the case where the voltage on the input line to PSTS is less than a lower limit of the band, the regulator 1310 may switch off or work in diminished capacity. It may also be possible to boost the input voltage to the PSTS 1318. Alternatively, a feedback mechanism may signal laser 1302 to increase the amount of light delivered to photodiode 1304. Examples of how circuit 1305 may be modified to allow for complete feedback (including too little power supply) are provided below.

FIG. 13B illustrates a circuit 1325 for regulating an input voltage created by an external power source while enabling feedback to laser source 1302 that can be co-located in the die active area with power receivers, test/trigger receivers, test structures and detection pads. The circuit 1325 may include the photodiode 1304, a reference ring oscillator 1308, PSTS 1318 and a feedback mechanism 1326. In an embodiment, laser 1302 directs light onto photodiode 1304. In actuality, a bank of photodiodes may be used. The ring oscillators 1326 provide a frequency output directly related and varied by the voltage from the photodiode 1304. Specifically, ring oscillator 1308 acts as a voltage controlled oscillator (VCO), the frequency of which is received by the feedback mechanism 1326. A single or a pair of capacitive pads 1328, 1329 combine to convert the oscillating voltage into a feedback signal to modulate the laser 1302 output. When the voltage caused by the laser 1302 is higher than the PSTS upper band, the ring oscillator output frequency is high and out of the desired range, and the feedback signal to laser 1302 reduces the output of the laser. When the voltage caused by the laser 1302 is lower than the PSTS lower band, the ring oscillator output frequency is too low, and the feedback signal causes laser 1302 to increase its power. In this way, the combination of the VCO 1308 and feedback mechanism 1326 can be used to monitor and control laser 1302 to regulate and increase and decrease power as necessary. Laser control unit 1332 monitors and controls the laser's timing and power output. Modulator 1331, such as an acousto-optic and/or electro-optic modulator, is used to modulate the timing and amplitude output of the laser, and may be used for noise suppression also.

FIG. 13C illustrates a circuit 1345 for regulating an input voltage created by an external power source while enabling feedback to laser source 1302 that can be co-located in the die active area with power receivers, test/trigger receivers, test structures and detection pads. The circuit 1345 may require fairly (relative to the power requirements for the test structure and the output buffer circuitry and drive for the pads) low levels of power. Circuit 1345 includes photodiode 1304, a voltage multiplier 1342, feedback mechanism 1326, PSTS 1318, and a regulator 1350. In an embodiment, the voltage multiplier is made using switched capacitor charge pumps. The regulator 1350 may include band-gap voltage reference 1352, comparator 1354, pulse-width modulator 1356, and a shunt regulator 1358, such as voltage buck circuits. In an embodiment, the output of the laser 1302 in FIGS. 13B, and 13C, can be driven by a laser power controller to modulate its amplitude and/or gating (pulsed-mode) function. Application of light from laser 1302 may initiate a fairly small voltage level from photodiode 1304. The voltage multiplier 1342 may multiply the voltage of photodiode 1304 so that the input voltage is more in the range of the upper and lower voltage limits for the PSTS 1318 to work properly. That is variations in its output signal are caused by process-specific variations and not induced by input signal voltage variations. The comparator 1354 may compare the voltage on the line with the reference voltage of the band-gap voltage reference 1352. If the reference voltage is exceeded, voltage buck circuits 1358 are triggered to drain current. This may correspond to threshold levels of each circuit's transistor being exceeded, thereby causing the respective transistor to switch at different (unaccepted) levels and times. Each voltage buck circuit 1358 may drain only a fraction of the total voltage drained. When the voltage buck circuits 1358 are switched, voltage is supplied to the pulse-width modulator 1358. The pulse-width modulator 1356 modulates the excess voltage. The modulated excess voltage is provided to feedback mechanism 1326. As described in FIG. 13B, this modulated voltage signal is used to increase or decrease laser 1302. In the event there is too much voltage created by laser 1302, the modulated voltage causes the laser 1302 to decrease power. In an embodiment, when the laser 1302 fails to provide sufficient power, the pulsed-width modulator 1356 becomes quiet. The act of becoming quiet is an input to the laser 1302 to increase its power. When the laser 1302 sufficiently increases the voltage provided from photodiode 1304, the pulsed-width modulator 1356 may start up again. Laser control unit 1332 monitors and controls the laser's timing and power output. Modulator 1331, such as an acousto-optic and/or electro-optic modulator, is used to modulate the timing and amplitude output of the laser, and may be used for noise suppression also.

An embodiment such as shown in FIG. 13C has several benefits. Among them, a relatively low amount of power is consumed in buffering the input voltage for the PSTS 1318. Furthermore, the feedback to the laser 1302 directs the laser to either increase or decrease power as needed for stability and repeatability across one or more test structures distributed on one or more die, scribe regions or other locations of the wafer.

Various techniques may be used to generate and regulate power within the chip, so as to be able to operate test structures on the chip without detrimentally affecting a usability of the chip. According to an embodiment such as described with FIGS. 13A, 13B and 13C, on-chip power generation is accomplished through use of a laser beam that provides a laser source to stimulate or energize an energy receiving pad 1304. A CW power signal may result. Some or all of the test structures on the chip may use the power signal. In one embodiment, application of the power signal is concurrent or simultaneous with application of another energy beam for the test/trigger signal. The power signal for some or all test structures on a chip may be generated through the energized power pad.

Alternative Power Generation

As described in embodiments of FIGS. 13A-13C, and with embodiments described elsewhere in this application, one source of off-chip power for causing the in-chip generation of the power signal (and possibly the test signal) is a laser that directs an energy beam onto a photodiode or other receiving element. However, alternative power generation mechanisms may also be used.

FIGS. 14A and 14B illustrate an embodiment in which a thermo-electric (or reverse thermo-electric a.k.a. Seebeck effect) mechanism is coupled with a laser or other energy source in order to cause in-chip generation of a power or test signal that can be co-located in the die active area with test/trigger receivers, test structures and detection pads. FIG. 14A is a top view of a p-n (doped) structure that is modified to separate its "p" region 1402 from the "n" region 1410. FIG. 14B is the corresponding cross-sectional view along lines A-A. For CMOS, an n-well 1404 that is electrically addressable through contact pad 1430 is added to isolate the p-well 1402 from the substrate 1406. A resulting gap 1414 (FIG. 14B) is created. A conductive plate 1450, such as may be formed by metal interconnects the "p" region 1402 with the "n" region 1404, and is placed over the "p" region 1402, "n" region 1404, and gap 1405 to save space.

A laser or other energy applying source may be used to heat the pad 1450. The heat excited carries in the respective "p" and "n" regions 1402, 1410. The result is that heat migrates away from or to the "p" and "n" regions 1402, 1410 respectively, that in turn, generates a movement of charge in the opposite direction to contacts 1440 and 1442 respectively. Since the majority carriers are of opposite sign for the "p" and "n" regions, the charges add constructively to form an aggregate voltage across pads 1440 and 1442. A feedback or modulating circuit can be used to regulate the power for stability and repeatability purposes.

Other power generation mechanisms may be used. For example, an inductive power generation mechanism positions in an inductive element in the die. Another inductive component is moved over the inductive element in order to generate a current in the die from the inductive element. A feedback or modulating circuit can be used to regulate the power for stability and repeatability purposes.

Other power generating mechanisms may be used. Examples of such mechanisms include use of RF signals to generate a current or voltage. For example, an RF signal may be applied to a resistive element to cause a voltage differential. Alternatively, a capacitive coupling may be used to generate sufficient energy to create one or both of the power and test signal. A feedback or modulating circuit can be used to regulate the power for stability and repeatability purposes.

In another embodiment, a first energy source 1108 may direct a modulated energy beam onto power receiver and modulator 1112, so that the resulting power signal for the test structure 1120 is modulated, albeit with a very slow period when compared with test structure speed, and has actively controlled stability and constancy of power delivered and received through the use of appropriately designed receiver 1112 and its associated circuitry for feedback and modulation of the energy source.

Apparatus for Non-Contact Detection and Measurement of Electrical Activity in Semiconductor Devices and Circuits FIG. 15 illustrates an electromechanically non-contact and non-invasive system 1500 for stimulating, detecting and measuring electrical activity from designated locations on a wafer. The designated locations may correspond to locations of specialized test structures or other elements that are capable of exhibiting electrical activity that can forecast chip fabrication quality and yield, and/or be correlated to how fabrication steps, sequences or processes were performed. In particular, the system 1500 may be used to interpret electrical activity detected from specialized test structures placed throughout the wafer (including intra-die) co-located with power and detection circuitry, of parameters and their variations that directly relate to and impact circuit performance and can thereby forecast final and performance yield or be correlated to the impact of fabrication steps or sequences during the fabrication of the devices and integrated circuits and elements on the wafer. An embodiment contemplates that system 1500 detects and measures electrical activities of the specialized test structures, co-located power and detection circuitry, distributed throughout the wafer, including inside the active regions of die and in the scribe regions (as illustrated in FIG. 1B). The test structures may exhibit electrical activity that exaggerates the presence (or absence) of attributes and results of fabrication steps or sequences. Examples of how such test structures may be implemented are described with FIGS. 4-10. An embodiment described with FIG. 15 may be configured to (i) activate the test structures, and (ii) detect electrical activity from the activated test structures, in a manner consistent with embodiment of FIGS. 11 and 12, such that all elements are co-located inside the active area of a die and do not require physical wiring and related contacts from the active areas to non-active areas of the die or to the scribe, or other portions of the wafer outside the die and its active area.

According to one implementation, first energy source 1510 generates an energy beam 1516 for receiver 1512. The first energy beam 1516 may comprise optical radiation having a wavelength $\lambda_1$. The first receiver 1512 may correspond to a photoreceiver (e.g. a photodiode) disposed on a surface of the die 1550. In one embodiment, the first receiver 1512 is a photodiode or similar device. The first energy source 1510 may be a device such as a continuous wave CW power laser (e.g. a laser diode or gas or solid-state laser) or other similar device with appropriate wavelength to ensure high efficiency coupling and absorption and containment within the photodiode structure. When implemented, the wavelength spectrum of the electromagnetic radiation emitted by the first energy source 1510 may overlap within the sensitivity region of the first receiver 1512. This energizes first receiver 1512 to produce and convert the electromagnetic energy to electrical power 1518. In one embodiment, for the case where first energy beam 1516 is an electromagnetic wave, receiver 1512 may correspond to an electromagnetic power receiver similar to the structure of a transformer.

According to one embodiment, a second receiver 1522, test/trigger signal, is arranged inside the die 1550 so as to be appropriately coupled with the second energy source 1520. The second receiver 1522 may also be a photodiode or a similar electro-optical device, or a metal line or dielectric for e-beam or ion-beam energy sources and beams, respectively. The second energy source 1520 may be a modulated power source, providing a modulated beam 1526. For example, the second energy source 1520 may be a time and/or amplitude modulated pulsed laser. The modulated beam 1526 may have a wavelength $\lambda_2$, which may be different from the wavelength $\lambda_1$ of the energy beam 1516. The second receiver 1522 is energized by the modulated beam 1526 to generate an alternating or modulating test/trigger signal 1528.

The power signal 1518 may be conditioned by a power conditioner 1519 prior to the signal being received by test structure 1530. A signal conditioner 1529 may also condition the test/trigger signal 1528 before being received by the test structure 1530. These conditioning, control and buffer circuits, similar to their associated receivers, are co-located in the active intra-die area with the test structures. In another embodiment, as described in FIGS. 13B and 13C, pre- and post-control and conditioning of the energy and timing sources before the silicon/device can be achieved to further regulate the stability of the signals at the test structures. After the power signal 1518 and the test/trigger signal 1528 activate the test structure 1530, an output 1538 from test structure is sent to detector pad 1540. The detector pad 1540 may include a signal receiver mechanism for receiving the output 1538. In one embodiment, detector pad 1540 transmits the output as an electromagnetic RF signal 1555, which could then be detected by an appropriate coupling non-contact electromagnetic RF detector 1574. One embodiment provides that the signal receiver mechanism of the detector pad to electromagnetically tag the output 1538 with an unique identifier before converting that signal into an RF transmission that can be detected by an RF detector 1574. In this way, the RF signal 1555 may have an electromagnetic signature associated with it that is particular and unique to each test structure 1530. The signatures uniquely enable the identification of each test structures electrical activity distributed on the wafer for identification, to pinpoint and distinguish by its associated signature. This can enable concurrent and simultaneous stimulation and detection of test structures on one or more one die and/or throughout the wafer.

As an alternative to an electromagnetic detection with an RF pad 1540 and RF detector 1574, a probe and detector configuration can be used to detect changes in the electrical potential at detector pad 1540 in a multi-beam configuration. In one embodiment, the third beam 1557, which may be in the form of an electron beam, can be incident and contained within detector pad 1540, such as a metal pad, to detect a voltage potential. The detected secondary electron emission collected at detector 1573 from pad 1540 will change as the surface potential of the pad is modulated by the electrical activity of test structure 1530. The modulated surface potential will modulate the secondary electron emission flux giving rise to voltage contrast changes of the collected third beam 1557, and will be detected by the detector 1573. The second beam 1516 used to create a test/trigger signal 1518 can also be used to improve the signal to noise of the third beam 1557 (which may be a secondary electron-beam).

In another embodiment, the third beam 1557 can be an ion beam that is shone on detector pad 1540 made of dielectric on Silicon to establish a known charge or voltage potential. A capacitive coupling of this charge on pad 1540 to a probe detector 1573 will modulate coincident with the electrical activity of test structure 1530. The second ion-beam 1516 used to create a test/trigger signal 1518 can be used to improve the signal to noise of the capacitive coupling.

As an addition or alternative to an electromagnetic detection such as illustrated with RF pad 1540 and RF detector 1574, a single or set of node-to-node detectors may be used to detect and measure various forms of electrical activity from individual nodes of the test structure 1530 when individual nodes respond to the power signal 1518 and/or the test signal 1528, or for the aggregate nodes of the test structure by comparing the first and last detected node. For example, a detector 1572 detects electrical activity at the first node of a chain of structures 1530. The detector 1572 detects electrical activity from second, and subsequent node of a chain of structures. The signal propagation evolution (e.g. delay, slew rates, "shape", etc.) from the first node to the second and subsequent nodes can be ascertained directly, or by comparison to the delay of the first, second and subsequent events to the test/trigger signal 1528. In one embodiment, the node-to-node detectors are appropriate photoreceivers (e.g. photodiodes), which detect optoelectronic effects from the light/photons induced by switching activities in the individual transistors' gates and junctions in the test structures 1530 (e.g. hot-electron induced photon emission detected by probe-less time-resolves photon-counting, charge-induced electro-rectification and electro-absorption probed and detected by gated laser, etc.).

As photo-receivers, each may detect and register optoelectronic signals from various elements of the test structure 1530. Each detector 1572 may be coupled by an appropriate optical train with objective lens (and/or lenses) to the appropriate junction or junction in the test structures. On the other hand, the sensitivity of the individual photo-receivers with wavelength $\lambda_1$ (energy source) and $\lambda_2$ (test/trigger energy source), which are characteristic of the beams from first and second energy sources 1510, 1520, may be reduced or shielded entirely to avoid interference. In an embodiment, one or more of the detectors 1572 may correspond to a time-resolved radiation detector, capable of providing high-resolution timing information on the registered hot-electron induced photon emissions. These kinds of photo-receivers may be structured from an avalanche photodiode and the associated circuitry that have been designed to operate in time-resolved for single photon counting mode. Alternatively, a multi-channel plate photomultiplier, coupled with a suitable detector, may be used as the photon counter.

Other types of detectors can be used for detecting different types of electrical activity from individual nodes.

Additional or Alternative Power and Detection Configuration Embodiments

Additional embodiments may employ test structures that can be activated and used with alternate intra die power sources. For example, an appropriately conditioned and controlled continuous wave CW laser source may be used in conjunction with a thermo-electric Seebeck power-generating device 1522 as shown in FIG. 14. As an alternative to using a laser as energy source 1520, an electron-beam source may be used to create the power signal 1518. For example, an electron-beam can be used as the second beam 1526 and it is directed onto second receiver 1522, which may include, for example, of a metal line connected to a device that converts the charge (or voltage) deposited or induced by the electron-beam into a current. In another embodiment, an ion-beam may be used as the second beam 1526, and it can be directed onto the second receiver 1522 that consists, for example, of a dielectric over a semiconductor material connected to a device that converts the charge (or voltage) deposited by the ion-beam into a current.

Additional embodiments may employ test structures that can be activated by an alternate source of test/trigger signal. For example, an electron-beam may act as the first energy beam 1516 that is directed onto the first receiver 1512 that consists, for example, of a metal line connected to a device that converts charge, or voltage, into a current pulse. In another embodiment, first energy beam 1516 may correspond to an ion beam can be directed onto the first receiver 1512 that consists, for example, of a dielectric over a semiconductor connected to a device that converts a voltage into a current pulse. As an alternative to use of the electromagnetic detection scheme of pad 1540 and detector 1574, and as an alternative to the detection scheme using an electron-beam probe and secondary-electron detector 1573, a laser beam source may be used to detect electrical activity in test structure 1530. For example, the third beam 1557 can be a laser beam directed onto a detector pad 1540 that consists, for example, of a photoreceiver that changes reflectivity or voltage in response to electrical activity in test structure 1530. Reflectivity modulation and/or voltage modulation from pad 1540 can be detected by detector 1573 and will be sensitive to electrical activity in test structure 1530. Alternatively, as an ion-beam, the third beam 1557 can be directed onto detector pad 1540 and the modulation in a capacitively coupled signal to electrical activity in test structure 1530 can be measured with detector 1573.

As an alternative to the use of optoelectronic signals to measure node-to-node switching activity, a fourth beam 1556, such as a time-gated/modulated laser beam (e.g. mode-locked and/or gated), can be used to detect a charge (current)-induced refractive or absorptive effect/signal at a specific node's diffusion/junction. This signal will modulate during the electrical switching induced by the test/trigger signal, and can be detected by a probe and appropriately coupled photo-receiver 1572.

Wafer Fabrication and Evaluation System

According to one embodiment of the invention, FIG. 16 provides additional details for an apparatus that induces and measures electrical activity from within designated locations of active regions in the die that include co-located power, test/trigger, process sensitive test structures and their associated buffering, regulation and shaping circuits. A stimulus and probe device 1640 may be operated in conjunction with the wafer handling elements to direct stimulus and position detectors and the associated electro-optic coupling mechanism between the apparatus and the wafers devices under test (DUT). Prior to taking of the measurements on a specific test structure, a wafer 1615 is placed on a movable stage 1612, which is controlled by the wafer handling and alignment unit 1611. Test structures, such as described in previous embodiments, may be imaged and found on the wafer 1615 through illumination (e.g. by using flood-illumination or a laser scanning microscope (LSM)), and imaged through the use of an imaging camera, such as a CCD ("Charged Coupling Device") array or vidicon camera 1610, or other similar imaging apparatus, for example, a photo-receiver for LSM.

According to an embodiment, the test structures may be placed within the active area of one or more die in wafer 1615, and are co-located with power and test/trigger circuitry in the active area. The stage 1612 is moveable to achieve a predetermined alignment between the test structures disposed on the wafer 1615 and the energy sources 1604, 1606 and/or the probe 1642 beam's and detectors 1602 and 1613. Microscope unit 1609 (e.g. electron, ion or optical based), with proper imaging and ability to isolate images and areas of interest in its field-of-view, is used to image, isolate and couple the signal onto the detector 1602, and to shape and focus the aforementioned energy beams, or probes, onto the devices to be measured. Alternatively, appropriate coupling leads (e.g. optical) can be attached to a probe head, which can be attached to the microscope and apertures to achieve the same. Probe and detector 1642 may require the use of imaging optics (e.g. electron, ion or optical, or combinations thereof) to place and receive the probe beam and detected signal, respectively.

The process sensitive test structures may be measured after completion of a designated process step in the fabrication. Different classes of test structures may be used just after completion of a particular process step(s) or sequences(s) in the fabrication. In general, the test structures are usable to evaluate a process in the fabrication just after the first level of connectivity (e.g. first-metal layer) is completed. Once the test structures are ready to be used, both a power and/or test/trigger signal is applied to the power and test/trigger receivers of the co-located test structure via stimulus and probe apparatus 1640. In an embodiment, the power and test signal may be applied to the test structures by a properly shaped (power modulated and noise suppressed) laser 1604 and modulating (in amplitude and/or time-gated) laser 1606, respectively. The power laser 1604 may provide a constant (DC) energy beam. The modulating beam 1606 may cause a modulated test/trigger signal to be generated on the wafer. Conductive elements may be disposed within the chip/die active area to carry the power and modulated test signal to the different test structures on the chip. In this way, no mechanical contact or interconnected regions outside of the active area are required to deliver stimuli to the test structures. Optoelectronic signals generated at or near the test structures may be detected and measured by detector 1602 from the test structures on the wafer 1615. In one embodiment, the detector 1602 detects and measures the signals and in a time-resolved manner. The test signal may also result in an output signal from each test structure. The output signal may be carried to a RF pad or antenna at which point the signals may be detected by the radio-frequency detector 1613. The detector 1602 and the radio-frequency detector 1613 may communicate with a data processing unit 1622, which converts the respective inputs/data into formats to be used and analyzed.

The overall operation of an apparatus such as described by FIG. 16 may be controlled by automation, system control, and/or manual operation. In one embodiment, a computerized control system 1605, or other data processing unit, is used comprising a graphical user interface (GUI) 1601, system control 1603, wafer and test structure circuit layout/design and location database map 1630 (such as those CAD-navigation products provided by Knights Technology), stimulus control 1632, and a data acquisition and analysis component 1622. Elements of the control system 1605 may be implemented as instructions carried on any computer-readable medium. Machines shown in FIG. 16 provide examples of processing resources and computer-readable mediums on which instructions for implementing embodiments of the invention can be carried and/or executed. In particular, the numerous machines shown with embodiments of the invention include processor(s) and various forms of memory for holing and manipulating data and instructions.

The system control 1603 may implement an automatic or programmatic control of mechanical aspects of the overall apparatus shown in FIG. 16. The programmatic control may be implemented through use of software or other computer-executable instructions. In the case of manual control, the GUI 1601 or other interface mechanism may be employed. The GUI 1601 enables an operator to select a fabrication and/or evaluation recipe for a DUT (Device Under Test). The GUI 1601 may also pass user-specified parameters and instructions to the system control 1603. The system control 1603 ensures seamless operability of the system. This includes arbitrating amongst the different modules in the system, and timing the various processes performed by the different modules so that the system operates asynchronously in an efficient manner. Thus, system control 1603 ensures that when one module in the system finishes its task before another module, it will wait for the other module.

The control system 1605 may use the wafer and test structure location database 1630, as well as stimulus control 1632 in operation to locate and stimulate individual test structures of the DUT. Evaluation information, which may include parameter values obtained from stimulating test structures, may be stored by the data acquisition and analysis component 1622. One or more algorithms or other processes may be performed by or through the data acquisition and analysis module 1622 to convert data of the performance parameter values into other forms of evaluation information, including statistical or quantitative analysis of the DUT.

Performing Test Measurements

FIG. 17 illustrates a die that is configured for use with RF output signals, according to an embodiment of the invention. A die 1700 may be configured to co-locate a power receiver 1720, and a plurality of test structure classes 1732, 1734, 1736 and 1738 in the active area. The power receiver 1720 produces the intra-die power signal, which in one embodiment, is constant. In an implementation, the die 1700 may also include a co-located test/trigger receiver 1710 in the active area for receiving and using test signals on distributed test structures. The test structures may be activated, through stimulus in the application of a power signal, and possibly a trigger in the application of a test/trigger signal. When activated, each test structure (e.g. $A_1$-$A_4$) in a particular class 1732-1738 may exhibit electrical activity, such as in the form of optical, optoelectronic, and/or radio frequency signals. A probe head may be brought into non-contact coupling to engage with the die 1700 for purpose of energizing the test/trigger receiver 1710 and power receiver 1720. Delivery of either (i) one energy beam to both the test/trigger receiver 1710 and power receiver 1720 or (ii) separate energy beams to each of the test/trigger receiver 1710 and power receiver 1720, may be accomplished through use of the probe head device that carries one or two (or more) sources of energy.

Multiple types of output signals and detection pads 1730 may be co-located in the active area, and used with corresponding test structure. One embodiment generates RF signals that correspond to test structure outputs. The RF signals may carry output information that includes switching speeds, slew rates, phase delays and other performance parameter values of a corresponding test structure, series of test structures, or set of test structures. For such an embodiment, one or more RF detection pads 1730 are used, so that the output may be in the form of an RF signal. The probe head may be equipped to detect the RF signal from each detection pad 1730 provided on the die 1700. In one embodiment, each RF signal may incorporate a signature or other identification mechanism to identify that RF signal over all other RF signals emitted from the chip or wafer. In this way, specific performance parameters may be correlated to known test structures. In one implementation, all test structures 1732-1738 may feed output signals to the RF pad, and transmissions from RF pad may identify each output signal based on a signature assigned to a specific test structure and/or a class of test structures, thereby achieving simultaneous pickup of multiple device responses. Alternatively, each of the test structure 1732-1738 may have its own RF pad to transmit its output signal.

It should be recognized that there may be multiple test/trigger receptors and power receptors, but that one test/trigger and power receptor can service multiple test structures and classes of test structures. The use of isolated test/trigger and power receptors that feed into multiple test structures allows for the test/trigger and power receptors to be energized simultaneously. In one embodiment, multiple test/trigger and power receptors are used in order to use the test structures at different processing steps. In one embodiment, multiple test/trigger and power receptors are used in order to use the test structures at different locations on the die 1700.

According to one embodiment, RF signals carry an aggregate signal for an overall test structure, or series of test structures. Other techniques for measuring such aggregate signals exist such as node-to-node detector systems that measure the first and last node in the aggregate test structure. In addition, node-to-node (intra-test structure) measurements may be made using, for example, optoelectronic signals.

FIG. 18 describes a method for operating an apparatus such as described in FIGS. 15-16, according to one embodiment of the invention.

Step 1810 provides that a test probe is brought into operational proximity of a wafer that is to be tested. This may include locating designated locations of die were testing is to be performed. A test probe may be brought into operational proximity with a wafer. This may include sub-steps of macro-alignment and micro-alignment. The macro-alignment may correspond to the probe head reading an optical marker on a surface of the wafer to receive the information for locating where the tests are to be performed. A similar micro-alignment may be performed within the boundaries of the chip. Using the alignments, the probe head is brought into operational proximity to the receptors for the power and test/trigger receivers on the chip. The wafer may be in a partially or completely fabricated step.

Step 1820 provides that the test/trigger and power receivers are energized in a contact-less, non-invasive and non-destructive manner. This may correspond to energizing the receivers with laser beams, such as described with FIGS. 15 and 16.

An embodiment provides that in step 1830, the probe head detects electrical activity from the various locations in the chip where test structures and/or detector pads are located. For example, with reference to FIG. 15, photon detectors 1572 detect photons from nodes within a test structure. The RF detector 1574 detects RF transmissions from detector pads 1540. Alternatively, probe and detector 1573 detects electrical activity using, for example, electron-beam voltage contrast. The probe head may make the measurements simultaneously, or move over various locations on the chip in order to make the measurements.

Finally, in step 1840, the electrical activity that was detected from the test structures is used to evaluate the fabrication of the wafer.

CONCLUSION

Although illustrative embodiments of the invention have been described in detail herein with reference to the accompanying drawings, it is to be understood that the invention is not limited to those precise embodiments. As such, many modifications and variations will be apparent to practitioners skilled in this art. Accordingly, it is intended that the scope of the invention be defined by the following claims and their equivalents. Furthermore, it is contemplated that a particular feature described either individually or as part of an embodiment can be combined with other individually described features, or parts of other embodiments, even if the other features and embodiments make no mentioned of the particular feature. This, the absence of describing combinations should not preclude the inventor from claiming rights to such combinations.

What is claimed is:

1. A method for evaluating fabrication of at least a portion of a wafer, the method comprising:
    (a) independently detecting and activating a plurality of test structures distributed at a plurality of locations on the portion of the wafer; the plurality of test structures being formed during a first fabrication process to establish electrical connectivity for a first set of elements which include the plurality of test structures, each test structure being activated and then detected without electrical or physical connectivity to any circuit elements that are part of a design of the product wafer;
    wherein independent detecting and activating is performed immediately after the first fabrication process;
    (b) programmatically correlating, with use of one or more computers, an output of one or more of the plurality of test structures to a specified performance parameter that is indicative of an attribute that results from performance of at least one or more fabrication processes for the wafer.

2. The method of claim 1, further comprising correlating the specified performance parameter during a design phase to at least one of the one or more fabrication processes.

3. The method of claim 1, further comprising correlating the specified performance parameter during a design phase to an attribute of a device on either a scribe or on any portion of the die of the product wafer; wherein the attribute is a result of at least of one or more fabrication processes.

4. The method of claim 3, wherein correlating the specified performance parameter to the attribute of the device on the die includes correlating the specified performance parameter to a gate length or gate width variation of any one or more switching elements on the die; wherein the gate length or gate width variation is a result of at least one of the one or more fabrication processes.

5. The method of claim 3, wherein correlating the specified performance parameter to the attribute of the device on the die includes correlating the specified performance parameter to a capacitance characteristic on any portion of the die; wherein the capacitance characteristic is a result of at least one of the one or more fabrication processes.

6. The method of claim 3, wherein correlating the specified performance parameter to the attribute of the device on the die includes correlating the specified performance parameter to a resistivity variation on any portion of the die; wherein the resistivity variation is expected from performance of fabrication of the product wafer.

7. The method of claim 3, wherein correlating the specified performance parameter to the attribute of the device on the die includes correlating the specified performance parameter to an electrical bias characteristic on any portion of the die, wherein the electrical bias characteristic results from the fabrication of the product wafer.

8. The method of claim 7, wherein the attribute is a result of one or more steps for patterning the product wafer.

9. The method of claim 3, wherein the attribute is a result of one or more steps for etching the product wafer including planarization.

10. The method of claim 3, wherein correlating the specified performance parameter to the attribute of the device on the die includes correlating the specified performance parameter to a resistivity variation of any one or more switching elements on the die; wherein the resistivity variation is a result of one or more steps or fabricating the wafer.

11. The method of claim 3, wherein correlating the specified performance parameter to the attribute of the device includes correlating the specified performance parameter to a leakage current of a device on the wafer.

12. The method of claim 3, wherein correlating the specified performance parameter to the attribute of the device includes correlating the specified performance parameter to a threshold voltage of a device on the wafer.

13. The method of claim 3, wherein correlating the specified performance parameter to the attribute of the device includes correlating the specified performance parameter to a current of a device on the wafer.

14. The method of claim 1, wherein the attribute corresponds to a variance that results from at least one of the one or more fabrication processes.

15. The method of claim 1, wherein (a) and (b) is performed during a design process for fabricating the wafer.

16. The method of claim 1, wherein (a) and (b) is performed during a test process in the fabrication.

17. The method of claim 1, wherein the one or more fabrication processes includes a manufacturing process for polishing the product wafer.

18. The method of claim 1, wherein the one or more fabrication processes includes a manufacturing process for implanting the product wafer.

19. The method of claim 1, wherein the one or more fabrication processes includes a manufacturing process for patterning the wafer.

20. The method of claim 1, wherein (a) and (b) is performed during an inspection process for fabricating the wafer.

21. The method of claim 1, wherein (a) and (b) is performed to determine yield for fabricating the wafer.

22. The method of claim 1, wherein (a) and (b) is performed to determine yield optimization for fabricating the wafer.

* * * * *